United States Patent
Houston et al.

(10) Patent No.: US 9,222,963 B2
(45) Date of Patent: Dec. 29, 2015

(54) SYSTEMS AND METHODS FOR METERING AND ANALYZING ENERGY CONSUMPTION OF EVENTS WITHIN A PORTABLE DEVICE

(71) Applicant: The Nielsen Company (US), LLC, New York, NY (US)

(72) Inventors: John Houston, New York, NY (US); Arun Ramaswamy, Tampa, FL (US); Brian Hopkins, Jersey City, NJ (US)

(73) Assignee: The Nielsen Company (US), LLC, New York, NY (US)

( * ) Notice: Subject to any disclaimer, the term of this patent is extended or adjusted under 35 U.S.C. 154(b) by 0 days.

(21) Appl. No.: 14/093,338

(22) Filed: Nov. 29, 2013

(65) Prior Publication Data

US 2014/0088895 A1  Mar. 27, 2014

Related U.S. Application Data

(60) Continuation of application No. 13/619,132, filed on Sep. 14, 2012, now Pat. No. 8,620,607, which is a division of application No. 13/222,969, filed on Aug. 31, 2011, now Pat. No. 8,364,429, which is a continuation of application No. 12/121,534, filed on May 15, 2008, now Pat. No. 8,032,317.

(51) Int. Cl.
*G01R 21/133* (2006.01)
*G01R 22/10* (2006.01)
*H04W 52/02* (2009.01)

(52) U.S. Cl.
CPC .............. *G01R 21/133* (2013.01); *G01R 22/10* (2013.01); *H04W 52/0258* (2013.01)

(58) Field of Classification Search
CPC .. G01R 21/133; G01R 22/10; H04W 52/0258
USPC ......... 702/60–63, 80, 89, 176, 183, 188, 189; 455/187.1, 566, 574; 713/300, 323; 716/111, 2
See application file for complete search history.

(56) References Cited

U.S. PATENT DOCUMENTS 4,525,055 A   6/1985 Yokoo
4,930,011 A   5/1990 Kiewit
(Continued)

FOREIGN PATENT DOCUMENTS

CN  101042744   9/2007
WO  2009140049  11/2009

OTHER PUBLICATIONS

United States Patent and Trademark Office, "Supplemental Notice of Allowance", issued in connection with U.S. Appl. No. 13/222,969, mailed Dec. 24, 2012 (2 pages).
(Continued)

*Primary Examiner* — John H Le
(74) *Attorney, Agent, or Firm* — Hanley, Flight & Zimmerman, LLC

(57) ABSTRACT

System and methods to determine the energy consumption per event type from usage data of portable devices are described. An example method includes accessing battery usage data for a first portable device, the battery usage data comprising a plurality of measurements, the measurements including an energy usage by the first portable device during a first time period and an identification of software functions executed by the first portable device during the first time period, and determining at portion of the energy usage attributable to a first one of the software functions based on the measurements.

12 Claims, 13 Drawing Sheets

(56) References Cited

U.S. PATENT DOCUMENTS

| | | | |
|---|---|---|---|
| 5,321,627 | A | 6/1994 | Reher |
| 5,434,508 | A | 7/1995 | Ishida |
| 5,809,449 | A | 9/1998 | Harper |
| 5,838,140 | A | 11/1998 | Rosenthal |
| 5,930,773 | A | 7/1999 | Crooks et al. |
| 6,078,871 | A | 6/2000 | Anderson |
| 6,088,688 | A | 7/2000 | Crooks et al. |
| 6,226,600 | B1 | 5/2001 | Rodenberg, III et al. |
| 6,353,929 | B1 | 3/2002 | Houston |
| 6,449,726 | B1 | 9/2002 | Smith |
| 6,577,962 | B1 | 6/2003 | Afshari |
| 6,636,030 | B1 | 10/2003 | Rose et al. |
| 6,653,816 | B2 | 11/2003 | Peek et al. |
| 6,745,011 | B1 | 6/2004 | Hendrickson et al. |
| 6,751,562 | B1 * | 6/2004 | Blackett et al. ............. 702/61 |
| 6,792,297 | B2 | 9/2004 | Cannon et al. |
| 6,794,849 | B2 | 9/2004 | Mori et al. |
| 6,810,338 | B2 | 10/2004 | Mercke et al. |
| 6,928,567 | B2 | 8/2005 | Nakai |
| 6,943,693 | B2 | 9/2005 | Kim |
| 6,970,131 | B2 | 11/2005 | Percy et al. |
| 7,019,659 | B2 | 3/2006 | Kobayashi et al. |
| 7,109,876 | B2 | 9/2006 | Smith et al. |
| 7,142,994 | B2 | 11/2006 | Rao et al. |
| 7,171,331 | B2 | 1/2007 | Vock et al. |
| 7,174,260 | B2 | 2/2007 | Tuff et al. |
| 7,197,397 | B2 | 3/2007 | Matsuda et al. |
| 7,216,021 | B2 | 5/2007 | Matsubara et al. |
| 7,222,031 | B2 | 5/2007 | Heatley |
| 7,243,044 | B2 | 7/2007 | McCalla |
| 7,409,303 | B2 | 8/2008 | Yeo et al. |
| 8,032,317 | B2 | 10/2011 | Houston et al. |
| 8,364,429 | B2 | 1/2013 | Houston et al. |
| 2002/0120369 | A1 | 8/2002 | Boies et al. |
| 2002/0120906 | A1 * | 8/2002 | Xia et al. ....................... 716/2 |
| 2002/0194511 | A1 | 12/2002 | Swoboda |
| 2003/0004662 | A1 | 1/2003 | Mitchell et al. |
| 2003/0233201 | A1 | 12/2003 | Horst et al. |
| 2004/0117137 | A1 | 6/2004 | Jin et al. |
| 2005/0027466 | A1 | 2/2005 | Steinmetz et al. |
| 2006/0117194 | A1 | 6/2006 | Nishida |
| 2006/0248366 | A1 | 11/2006 | Schumacher et al. |
| 2007/0066311 | A1 | 3/2007 | Reibel et al. |
| 2007/0118309 | A1 | 5/2007 | Stewart |
| 2007/0219732 | A1 | 9/2007 | Creus et al. |
| 2008/0057894 | A1 * | 3/2008 | Aleksic et al. ............ 455/187.1 |
| 2009/0195349 | A1 | 8/2009 | Frader-Thompson et al. |
| 2011/0040990 | A1 | 2/2011 | Chan et al. |

OTHER PUBLICATIONS

United States Patent and Trademark Office, "Notice of Allowance", issued in connection with U.S. Appl. No. 13/222,969, mailed Sep. 10, 2012 (9 pages).

United States Patent and Trademark Office, "Final Office Action", issued in connection with U.S. Appl. No. 13/222,969, mailed Aug. 14, 2012 (13 pages).

United States Patent and Trademark Office, "Restriction Requirement", issued in connection with U.S. Appl. No. 13/222,969, mailed Jun. 18, 2012 (8 pages).

United States Patent and Trademark Office, "Non-Final Office Action", issued in connection with U.S. Appl. No. 13/222,969, mailed Dec. 28, 2011 (11 pages).

Chinese Patent Office, "First Office Action", issued in connection with Chinese Patent Application No. 200980117540, mailed Sep. 12, 2012 (18 pages).

Chinese Patent Office, "Second Office Action", issued in connection with Chinese Patent Application No. 200980117540, mailed Mar. 29, 2013 (6 pages).

Korean Patent Office, "Notice of Allowance", issued in connection with Korean Patent Application No. 10-2010-7025616, mailed Jul. 10, 2012 (3 pages).

Korean Patent Office, "Notice of Preliminary Rejection", issued in connection with Korean Patent Application No. 10-2010-7025616, mailed Feb. 10, 2012 (5 pages).

International Searching Authority, "Written Opinion", issued in connection with PCT Patent Application No. PCT/US09/41828, mailed Jun. 15, 2009 (4 pages).

International Searching Authority, "International Search Report", issued in connection with PCT Patent Application No. PCT/US09/41828, mailed Jun. 15, 2009 (2 pages).

International Searching Authority, "International Preliminart Report on Patentability", issued in connection with PCT Patent Application No. PCT/US09/41828, issued Nov. 17, 2010 (5 pages).

"Optimizing Mobile Software with Built-in Power Profiling", Nokia, Version 1.0, May 19, 2009 (18 pages).

"Energy Star—The Power to Protect the Environment through Energy Efficiency", United States Environmental Protection Agency, Jul. 2003 (16 pages).

"What is a HERS rating?", Energy Star, <http://energystar.custhelp.com/cgi-bin/energystar.cfg/php/enduser/std_adp.php?p_faqid=>, retrieved Nov. 11, 2007, (2 pages).

"About Energy Star,", Energy Start, <http://www.energystar.gov/index.cfm?c=about.ab_index>, retrieved Nov. 20, 2007, (1 page).

"Energy Star Overview of 2006 Achievements," Energy Star, All values and figures are preliminary as of Mar. 1, 2007 (4 pages).

SmartPlanet, "Solo, Duet & Trio energy monitors queue up to smash Wattson and OWL," CRAVE, CNET UK, Sep. 16, 2008, (4 pages).

Rikke Bruntse-Dahl, "Move over Wattson, here comes Ewgeco," News at SmartPlanet.com, Mar. 18, 2008, 7 pages.

"Valpo Students Launch New iPhone Application," Inside Indiana Business with Gerry Dick, [retrieved from the Internet on Jul. 15, 2009]. Retrieved from the Internet: http://www.insideindianabusiness.com/newsitem.asp?ID=36553, (2 Pages).

Tim Stevens, "Powering Google's PowerMeter: testing TED 5000 and AlertMe Energy," posted on the internet Dec. 8, 2009, (16 pages).

BAPCO, "Mobile Mark 2005," Revision 1.0, May 26, 2005, (30 pages).

Gurun et al., "A Run-Time, Feedback-Based Energy Estimation Model for Embedded Devices," CODES+ISSS'06, Oct. 22-25, 2006, (6 pages).

Flinn et al., "Managing Battery Lifetime with Energy-Aware Adaptation," (ACM Transactions on Computer Systems), May 2004, 43 pages, vol. 22, No. 2.

"About This Book", Springer: The Language of Science, Overview of Fitzek, Frank H.P., "Mobile Phone Programming and its Application to Wireless Networking,", Apr. 11, 2008, retieved from <http://www.springer.com/engineering/signals/book/978-1-4020-5968-1> (1 page).

"Quick Start Guide", Nokia Energy Profiler, Apr. 11, 2008, 4 pages. http://www.forum.nokia.com/main/resources/development_process/power_management.

United States Patent and Trademark Office, "Non-Final Office Action" issued in connection with U.S. Appl. No. 12/121,534, mailed Feb. 3, 2011 (12 pages).

United States Patent and Trademark Office, "Notice of Allowance" issued in connection with U.S. Appl. No. 12/121,534, mailed Jun. 2, 2011 (15 pages).

United States Patent and Trademark Office, "Non-Final Office Action" issued in connection with U.S. Appl. No. 13/619,132, mailed Apr. 22, 2013 (8 pages).

United States Patent and Trademark Office, "Notice of Allowance" issued in connection with U.S. Appl. No. 13/619,132, mailed Aug. 21, 2013 (8 pages).

\* cited by examiner

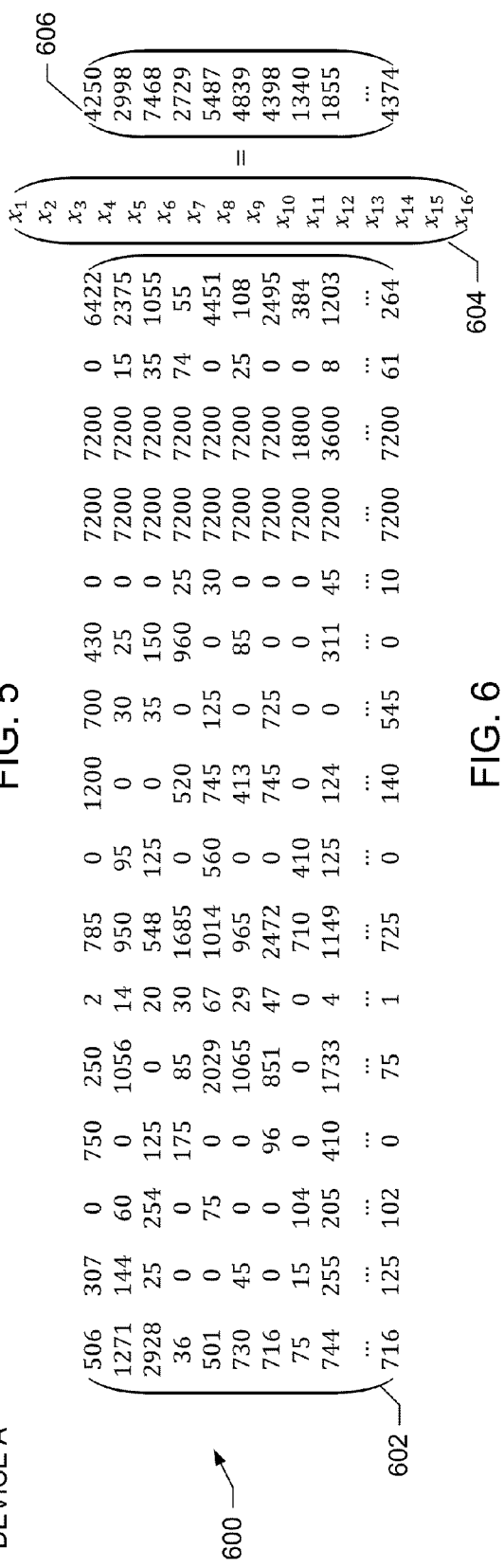

| GENERAL SUMMARY STATISTICS | | | | | | | | | | | |
|---|---|---|---|---|---|---|---|---|---|---|---|
| | | | ENERGY PER APPLICATION (J/s) | | | | | | | | |
| DEVICE | TOTAL DEVICES | AVERAGE ENERGY USE (J/2h) | PHONE | TEXT | E-MAIL | WEB | MEDIA PLAYER | CAMERA (J/pic) | DOC | STREAM | LIVE MEDIA | GAMES | VIDEO RECORD | OS |
| DEVICE A | 352 | 3540 | 0.7697 | 0.5501 | 0.5904 | 1.1259 | 0.9554 | 19.2216 | 0.5124 | 1.2242 | 1.38846 | 1.5476 | 2.1942 | 0.0377 |
| DEVICE B | 251 | 4250 | 0.6515 | 0.5641 | 0.5585 | 1.1855 | 1.1754 | 22.0564 | 0.5847 | 1.1147 | 1.2975 | 1.4771 | 2.2544 | 0.0267 |
| DEVICE C | 185 | 5580 | 0.8851 | 0.7585 | 0.7891 | 1.8426 | 1.5442 | n/a | 0.4977 | 0.9744 | 1.2556 | 1.8665 | n/a | 0.0543 |
| DEVICE D | 588 | 3105 | 0.4585 | 0.4514 | 0.4835 | 1.0354 | 0.9784 | 17.64 | 0.4118 | 1.2443 | 1.1334 | 1.7448 | 1.8164 | 0.02195 |

FIG. 7A

| GENERAL SUMMARY STATISTICS | | | | | | | | |
|---|---|---|---|---|---|---|---|---|
| | | | ENERGY PER HARDWARE FUNCTION (J/s) | | | | | |
| DEVICE | TOTAL DEVICES | AVERAGE ENERGY USE (J/2h) | VIBE | SPEAKER | TRANSMITTER | RECEIVER | KEY INPUT (J/key) | BRIGHT DISPLAY |
| DEVICE A | 352 | 3540 | 2.1462 | 0.3715 | 1.2274 | 0.0854 | 0.0021 | 0.1443 |
| DEVICE B | 251 | 4250 | 2.5182 | 0.2554 | 1.3559 | 0.0944 | 0.0034 | 0.1174 |
| DEVICE C | 185 | 5580 | 3.7516 | 0.4172 | 2.0447 | 0.1447 | 0.0075 | 0.2584 |
| DEVICE D | 588 | 3105 | 1.9274 | 0.2519 | 1.1342 | 0.0744 | 0.0011 | 0.1183 |

FIG. 7B

SYSTEMS AND METHODS FOR METERING AND ANALYZING ENERGY CONSUMPTION OF EVENTS WITHIN A PORTABLE DEVICE

RELATED APPLICATIONS

This patent arises from a continuation of U.S. patent application Ser. No. 13/619,132, filed Sep. 14, 2012, which is a divisional of U.S. patent application Ser. No. 13/222,969, filed on Aug. 31, 2011, which is a continuation of U.S. patent application Ser. No. 12/121,534, filed May 15, 2008, the entireties of which are hereby incorporated by reference.

FIELD OF THE DISCLOSURE

This disclosure relates generally to the field of data collection on wireless devices and, more particularly, to a system and methods for metering and analyzing the energy consumption of events within a portable device.

BACKGROUND

The increasing number of portable devices, cellular phones, laptops, personal digital assistants, text message machines, wireless gaming machines, music players, etc. has increased the need to measure their use for various purposes. For example, measuring a user's interaction with a portable device provides visibility of the types of services and applications that may interest a user. Similarly, measuring the performance of a portable device enables manufacturers, wireless service providers, content providers, etc. to improve their products and services. There is an increasing array of functionality available for portable devices with varying degrees of resource usage and power requirements. Consumers are able to incorporate applications from a large number of application developers into their portable devices. As a result, there are many portable devices in use, many different types of portable devices, and a large number of applications that may be installed and run on the wide array of portable devices. It is extremely difficult, if not impossible, for portable device manufacturers, consumers, and application developers to measure the performance for every combination of possible applications and portable devices.

Currently, portable device manufacturers determine energy use of their portable devices by installing and running baseline software applications in a controlled laboratory environment. A programmed script executes the applications according to a pre-determined pattern while hardware measuring equipment tracks the battery life remaining in the portable device and corresponding parametric information. The testing method provides a snapshot of portable device performance for the small number of portable devices tested. The baseline testing does not test for many environmental and parametric operating conditions the portable device may experience over its lifetime. Additionally, the baseline software applications may not be representative of the complex applications and/or the combination of the complex applications provided by third party application developers available to consumers.

BRIEF DESCRIPTION OF THE DRAWINGS

FIG. 5 shows a table of an example event log compiler table constructed by the data analyzer of FIG. 2.

FIG. 6 shows a matrix equation of an example energy consumption matrix equation constructed from the event log compiler table of FIG. 5.

FIGS. 7A-7B show tables of example energy consumption reports including a summary statistics section and event result sections.

DETAILED DESCRIPTION

Figure 1:
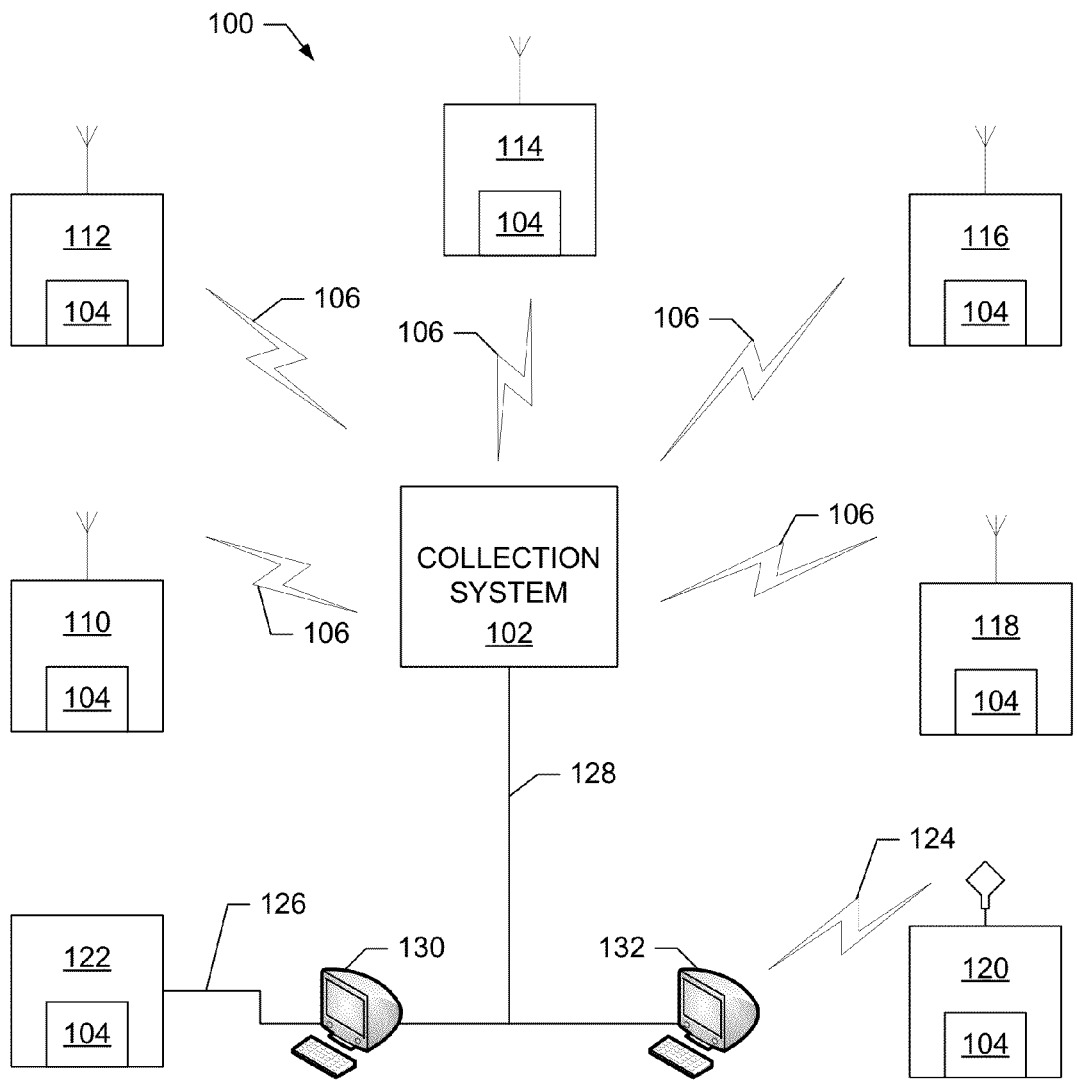
FIG. 1 is a block diagram of an example metering system to meter and collect portable device energy consumption data and event information.

Although the following describes example methods and apparatus including, among other components, software and/or firmware executed on hardware, it should be noted that these examples are merely illustrative and should not be considered as limiting. For example, it is contemplated that any or all of the hardware, software, and firmware components could be embodied exclusively in hardware, exclusively in software, or in any combination of hardware and software. Accordingly, while the following describes example methods and apparatus, the examples provided are not the only way to implement such methods and apparatus.

The example meter, methods, system and/or machine readable instructions described herein may be used to monitor and analyze energy consumption of events within a portable device to determine energy consumed for an event per unit of time. An example method of monitoring energy consumption of events within a portable device involves collecting event metering information and energy consumption data associated with the portable device, communicating the energy consumption data and event metering information to a collection system, and analyzing the energy consumption of events on a portable device from a plurality of panel members. The energy consumption data and event information from each device for a time period may be structured into a linear equation. A plurality of such linear equations can be solved to determine an approximate energy use per event per a unit of time for a plurality of devices and/or panel members.

In an example method described herein, energy consumption may be metered by measuring battery characteristics at the start and end of a time period. Additionally, the battery may be measured at incremental instances through the time period. In another example method, energy consumption may metered by determining a baseline for energy consumption per clock cycle and then counting the number of clock cycles used per event.

An example system to monitor energy consumption of events within the portable device includes a metering component to receive event information within a portable device. Event information may include hardware and/or application information such as application type, duration of usage, network or portable device parametric information (e.g., upload speed, download speed, network quality, volume and/or tone) and/or metadata (e.g., content title, author, date of publication, source and/or publisher information, copyright information, digital rights management information, etc). Applications may include phoning, text messaging, instant messaging, e-mail, web browsing, media player, camera, document processing, streaming data from a server, live media, games, video recording, media editing, etc. Hardware may include the operating system, clock cycles, a vibration actuator, a ringer, a speaker, key inputs, electrical battery measurements, a receiver, a transmitter, a touch screen, a bright display, and/or any other energy consuming electro-mechanical device and/or hardware associated with the portable device. Energy consumption data and event information may be referred to as metered portable device information.

The example system described herein also includes a processor that may be communicatively coupled or included within the portable device and configured to receive energy consumption data and event information from the metering component. The processor may also process and store the metered portable device information within an event log cache. Additionally, the example system includes a memory communicatively coupled to the processor to store the metered portable device information and a communication interface to communicate the metered portable device information to a collection system (e.g., a computer, a measurement entity, server, etc.). The memory includes the event log cache, which stores a plurality of metered portable device information for different time periods.

An example system to analyze energy consumption of events within a portable device includes the collection system, a memory, and an analysis system. The analysis system and the memory may be included within the collection system or, alternatively, may be communicatively coupled to the collection system. The collection system may be included within or provided by a measurement company, which may be a neutral entity that does not create and/or distribute portable devices and/or events on portable devices and, thus, can function as a trusted third party monitor of the energy consumption and metering information of portable devices. The collection system receives and stores metered portable device information from a plurality of portable devices.

The analysis system processes the metered portable device information. Processing may include filtering the energy consumption data and event information based on device type, application type, function type, and/or a combination of device types, application types and/or function types. The filtered energy consumption data and event information for a device for a time period is structured or constructed into a linear equation. The analysis system solves for a plurality of linear equations to determine an approximate energy use per event type per a unit of time. These results may be refined to eliminate large error terms and recalculated. Calculating large quantities of portable device energy consumption data and event information compensates for slight differences in energy consumption data between portable devices and/or any errors from measuring energy consumption. This may provide more accurate data then simply attempting to measure and quantify energy consumption per event type on a single portable device using complex measuring systems.

The approximation for energy use per event type for a unit of time data may be reported to portable device developers, application developers, hardware developers, function developers, consumers, etc. For example, a game developer can look at an energy consumption report and view the energy consumption of their current games on a plurality of portable devices. From this information, they may be able to develop future games that consume less power and/or games that utilize processing components on portable devices in a manner that consumes less power. Additionally, they could market the game as energy efficient for portable devices.

Portable devices may include cellular phones, laptops, personal digital assistants (PDAs), audio players, portable video players, portable gaming machines, pocket personal computers, and/or any other portable device that may be powered by a self-contained power supply. Portable devices may send and receive information wirelessly. For instance, wireless telephone service providers allow subscribers to place and receive voice telephone calls, send and receive photos, participate in text messaging, send and receive e-mail messages, browse web pages, and/or download and/or stream music broadcasts, MP3 files (including proprietary and non-proprietary digital audio/video format variations), talk radio broadcasts, news broadcasts, and various broadcast entertainment programs (e.g., sitcoms, movies, etc.). The portable devices may include speakers to allow the user to hear analog audio signals, and/or a display, such as a liquid crystal display (LCD) screen to allow the user to view video signals.

Wireless portable devices may send metered portable device information to the collection system through wireless server provider networks. Alternatively, portable devices may send metered portable device information to the collection system through a wired connection via an Internet service provider by transmitting the metered portable device information to a computer via, for example, infrared signals, IEEE-802.11 signals, Bluetooth® signals, and/or other optical and radio frequency signal technologies. Alternatively, a portable device may be connected to a computer via a wired connection such as, for example, a USB connection, and transmit the data to a collection system over an Internet connection.

In other examples, the methods and system used to monitor and analyze energy consumption of events within a portable device may additionally or alternatively be used to monitor energy consumption by events of other devices (e.g., computers, game consoles, digital versatile disk ("DVD") players, video cassette recorders ("VCRs"), televisions, stereos, etc.) and/or device applications (e.g., device software applications, device hardware applications, etc.).

FIG. 1 is a block diagram of an example metering system 100 within which the system and methods described in greater detail below may be used to meter and collect portable device energy consumption data and event information. The example metering system 100 includes a collection system 102, portable devices 110-122, and personal computers 130-132. The portable devices 110-122 include a metering component 104 to collect portable device information. The portable devices 110-122 include, but are not limited to cellular phones, laptops, personal digital assistants (PDAs), audio players, portable video players, portable gaming machines, pocket personal computers, and/or any other portable device that may be powered by a self-contained power supply (e.g., a battery). The portable devices 110-118 can communicate with the collection system 102 via respective wireless links 106, the portable device 120 can communicate with the collection system 102 via a local wireless line or link 124 to the personal computer 132 and/or access point that is connected to a wired network 128, and the portable device 122 can communicate with the collection system 102 via a wired link 126 to the personal computer 130 that is connected to the wired network 128.

In the example implementation, each of the portable devices 110-122 may be in the possession of and/or belong to a panel member. Additionally, the portable devices 110-122 may be shared between a plurality of panel members and/or one panel member may use a plurality of the portable devices 110-122. The metering component 104 may be activated by a panel member subscribing or registering with a metering service such as, for example, Nielsen Mobile™. The collection system 102 may send the metering component 104 to the subscribing panel member to install and/or attach to a portable device. The metering component 104 may be sent as software over one of the wireless links 106, a wired connection through a personal computer that may be transmitted via a wire or wirelessly to the portable device, and/or sent within a memory device via the mail. Additionally or alternatively, the metering component 104 may be installed within a hardware component such as, for example, an application specific integrated circuit (ASIC), and/or installed or embedded within the operating system and/or read only memory (ROM) during manufacture of the portable device. In this example, a panel member may register with the metering service to activate the metering hardware and/or software within one of the portable devices 110-122.

In the example system 100, the metering component 104 monitors portable device use by a panel member and the corresponding amount of energy consumed by the portable device. The metering component 104 may operate in the background of the operating system, applications, and/or hardware of the portable device. Data gathered by the metering component 104 is sent or communicated to a processor and/or an event log within the memory of the portable device 110-122. In another example implementation, the metering component 104 sends or communicates the data to a personal computer having a processor and memory that processes and stores the data. The data may be transmitted to one of the remote or wide area wireless links 106 to the collection system 102, a local wireless link 124 to the personal computer 132 connected to a network 128 including the collection system 102, and/or a wired link 126 to the personal computer 130 connected to the network 128.

The data includes event information and energy consumption of the battery over a plurality of time periods. Event information may include a log of applications and/or hardware functions accessed by a panel member, portable device parametric information, and/or network parametric (e.g., quality) information. The data for a time period may be saved to the memory of the portable devices 110-122 as part of an event log cache. The event log cache accumulates metered portable device information for a plurality of time periods. The metering component 104 within the portable devices 110-122 transmits event logs from the portable device memory to the collection system 102. The portable devices 110-122 may send the event logs when the event log cache is full, when the collection system 102 sends a request or query to the portable devices 110-122, during predetermined times of a day or week, and/or when the portable devices 110-122 are in an idle state. The event log structure is described in further detail in FIG. 4A.

The metering component 104 may, for example, be configured to collect event information over a two hour time period. During this time period, the metering component 104 collects the types of applications a panel member uses on a portable device, the duration each application is used, network parametric information if any of the applications transmit or receive data, portable device parametric information, and/or information regarding hardware functions used. In addition, the metering component 104 measures the current and voltage of the battery within the portable device at intervals over the two hour time period. Thus, the metering component 104 collects the portable device events and the total energy consumed during the two hour time period. After the two hour time period, the metering component 104 stores the event and battery information to the event log cache. Subsequently, the metering component 104 may store data collected over additional time periods to the event log cache. The metering component 104 then sends the event logs to the collection system 102. In an alternative implementation, the metering component 104 may store event information to the event log cache periodically during the time period.

The collection system 102 within the metering system 100 is configured to receive event logs from the portable devices 110-122 and may include a computer, a server, a measurement entity, a processor, etc. Additionally, the collection system 102 may include a memory to store the event logs, a processor to organize and filter the event logs and an analyzer to calculate energy consumption per event per unit of time. The collection system 102 may be part of a metering service and connected to a network including a wireless network to communicate with portable devices wirelessly and through wired connections. For example, the collection system 102 may be located at a specific IP address. The portable devices 110-122 may access the IP address, and/or web address associated with the IP address to download the metering component 104, transmit panel member demographic information, transmit event logs, and/or register application licensing agreements. Additionally, the transmitted and received data may be encrypted to secure the identity and personal information of panel member. The metering component 104 may be sent from the collection system 102 to a portable device that has registered with the metering service. The collection system 102 is described in greater detail in FIG. 2.

In the example implementation of FIG. 1, the portable devices 110-118 use the wireless links 106 to communicate with the collection system 102. The wireless links 106 may operate on any type of wireless network. For example, a circuit switched network, a paging network, and/or packet data networks including, but not limited to, AMPS, CDMA, TDMA, GSM, iDEN, GPRS, 3XRTT, 3GSM, LTE, EDGE, WiMax, etc. The metering component 104 and data transmission across the wireless links 106 may adhere to and incorporate wireless protocols and standards for voice and data communication services on networks and devices. These standards include TIA/EIA95-B (Mobile Base Station Compatibility for Wideband Spread Spectrum Cellular Systems), ANSI J-STD-008 (Personal Station-Base Station Compatibility Requirements for 1.8 to 2.0 GHz Code Division Multiple Access Personal Communication Systems), ANSI J-STD 018 (Minimum Performance Requirements for 1.8 to 2.0 GHz Code Division Multiple Access Personal Stations), TIA/EIA/IS-99 (Data Services Option Standard for Wideband Spread Spectrum Digital Cellular Systems), TIA/EIA-637-A (Short Message Service for Spread Spectrum Systems), TIA/EIA-683-A (Over-the-Air Provisioning of Mobile Stations in Spread Spectrum Systems), and various WAP documents (Wireless Application Protocol Architecture Specification, Wireless Application Environmental Specification, Wireless Telephony Application Specification, Wireless Transaction Protocol Specification, Wireless Datagram Protocol Specification, etc.).

In the example metering system 100, the portable device 120 is communicatively coupled to the personal computer 132 via the local wireless link 124. The portable device 120 is not configured to communicate over the wireless links 106 on a circuit switched network. The local wireless link 124 enables data transfer (e.g., the transfer of metered portable device information) between the portable device 120 and the personal computer 132. The local wireless link 124 may include communication between the portable device 120 and the personal computer 132 via an access point such as, for example, IEEE 802.11x access points, xDSL modems, residential gateways, etc. Alternatively, the portable device 120 may communicate with the personal computer 132 directly via, for example, a Bluetooth® based communication scheme. The personal computer 132 may send or send the metered portable device information to the collection system 102 through the network 128 via the access point or, alternatively, the portable device 120 may connect to the network 128 through the personal computer 132. The network 128 may, for example, be a wired or wireless telephone network, a cable network, a satellite network, a utility (e.g., electrical service) network, etc. and may provide Internet services and/or media content delivery services to the personal computer 132 and/or the portable device 120.

In the example of FIG. 1, the portable device 122 is communicatively coupled to the personal computer 130 via the wired link 126. The portable device 122 is not configured to communicate wirelessly. The wired link 126 may include a USB cable that may be used as a data transmission medium and/or a power transmission medium between the portable device 122 and the personal computer 130. The portable device 122 may download the metered portable device information to the personal computer 130 that may then send the metered portable device information to the collection system 102 through the network 128. Alternatively, the portable device 120 may connect to the network 128 through the personal computer 130 and send the metered portable device information directly to the collection system 102. The network 128, for example, may be a wired or wireless telephone network, a cable network, a satellite network, a utility (e.g., electrical service) network, etc. and may provide Internet services and/or media content delivery services to the personal computer 130 and/or portable device 122.

In addition to enabling the communication of metering information to the collection system 102, the communication network 128 may enable the personal computers 130 and 132 to receive or retrieve media content from a plurality of content providers (not shown) via the communication network 128. The content providers may provide a variety of media content such as, for example, television programs, advertisements, audio programs, still image information (e.g., web pages). A panel member may use one of the personal computers 130 and 132 to download and/or retrieve media content provided by content providers via the communication network 128 and may subsequently synchronize, copy, or download the retrieved media content to the portable devices 120 and 122.

Figure 2:
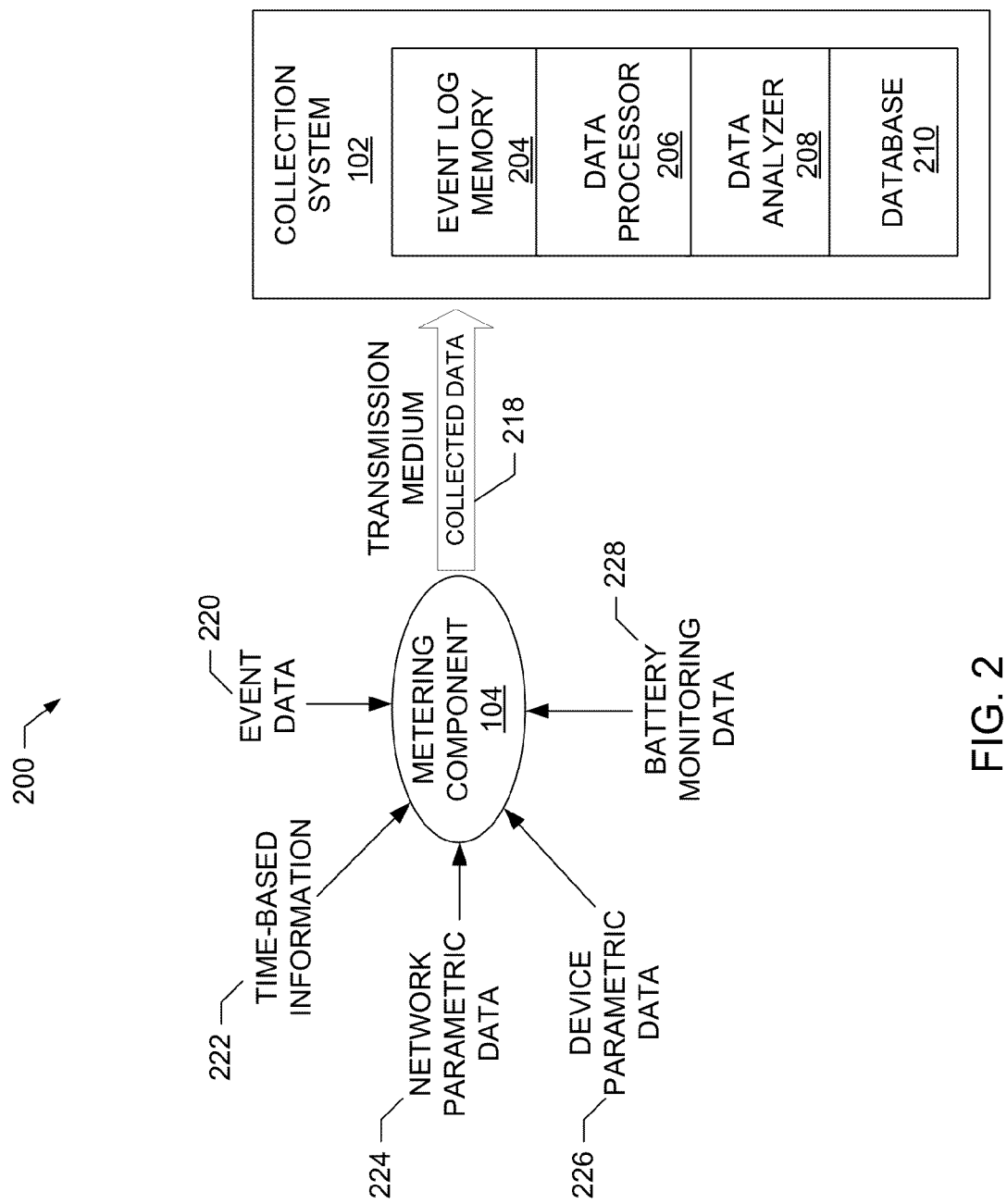
FIG. 2 shows a functional block diagram of an example metering and collection system including the metering component and the collection system of FIG. 1.

FIG. 2 shows a detailed functional block diagram of an example metering and collection system 200 including the metering component 104 and the collection system 102 of FIG. 1. The collection system 102 includes an event log memory 204, a data processor 206, a data analyzer 208, and a database 210. The metering component 104 receives event data or metered portable device information in the form of event data 220, time-based information 222, network parametric data 224, device parametric data 226, and/or battery monitoring data 228.

While FIG. 2 shows an example manner of implementing the collection system 102, one or more of the functional blocks, processes and/or devices illustrated may be combined, divided, re-arranged, omitted, eliminated and/or implemented in any other way. Further, the example collection system 102 may be implemented by hardware, software, firmware and/or any combination of hardware, software and/or firmware. Thus, for example, any component of the example collection system 102 could be implemented by one or more circuit(s), programmable processor(s), application specific integrated circuit(s) (ASIC(s)), programmable logic device(s) (PLD(s)) and/or field programmable logic device(s) (FPLD(s)), etc. Further, the collection system 102 may include one or more elements, processes and/or devices in addition to, or instead of, those illustrated in FIG. 2, and/or may include more than one of any or all of the illustrated elements, processes and devices.

In the example implementation, the metering component 104 and the collection system 102 are linked by (i.e., communicatively coupled via) a transmission medium 218. The transmission medium 218 may include, for example, wireless networks and wired networks as described in FIG. 1. The metering component 104 may send metered portable device information in the form of event logs from the memory of a portable device directly to the collection system 102 within a network over the transmission medium 218 or, alternatively, may send the metered portable device information to a personal computer and/or network access point connected to the collection system 102 by the transmission medium 218. The metered portable device information may be transmitted by a request to the metering component 104 from the collection system 102, at preprogrammed specified intervals, and/or at the discretion of the portable device. For example, the metering component 104 on the portable device may be configured to transmit the event logs to the collection system 102 every twelve hours, when the event log cache within the memory is full, when the portable device is in an idle state, and/or when the panel member associated with the portable device initiates the transfer.

The metering component 104 monitors events and power consumption on a portable device. Events include applications and the corresponding time information, network parametric data, device parametric data, and battery data. The event data 220 includes any data relating to activity on the portable device initiated by a panel member. For example, the event data 220 includes usage information from data applications, device applications, metadata, and event statistics. Data applications include, for example, Internet browsing, live media applications, mobile commerce transactions, mobile advertising activity, e-mail activity, etc. Device applications include, for example, games, address books, personal information management software, document processing programs, and media players used for streaming audio and video. Metadata includes attributes of device applications, for example, content title, author, date of publication, source and/or publisher information, copyright information, digital rights management information, etc. Event statistics includes, for example, voice and data call activity, text-messaging, instant messaging, etc. The time-based information 222 includes, for example, the duration of application usage, and calendar data (e.g., month, week, day, hour, minute, second). The time-based information 222 may enable the metering component 104 to follow a schedule of the time periods the metering component 104 is configured to monitor events on the portable device. For example, a metering service, such as for example, Nielsen Mobile™, may configure the metering components 104 of a plurality of portable devices to collect metered portable device information from 3:00 P.M. to 5:00 P.M. to ensure the data analyzer 208 has common data from the plurality of portable devices for analysis.

The network parametric data 224 includes, for example, overhead messaging data such as system parameter messages, authentication challenge messages, and service reduction messages in addition to signal quality, upload, and download speeds, transmission frequency, signal strength, signal-to-noise ratio, etc. The device parametric data 226 includes, for example, frame error rate, call set-up statistics (e.g., access time, call origination, and call termination) and data from hardware components of the portable device, such as processors (mobile station modem or equivalent, global positioning system processor or equivalent, graphics processor, and other central processing units on the portable device), volatile and non-volatile memory, vibration actuator, speaker, key inputs, receiver, transmitter, touch screen, bright display, operating system, etc. In addition, the device parametric data 226 may include a clock cycle speed and/or clock cycle count of the processor and/or central processing unit of the portable device.

The battery monitoring data 228 includes, for example, charging state, voltage, temperature, current, internal resistance, accumulated current, etc. Additionally, the battery monitoring data 228 may include measurable power consumption of hardware components within the portable device such as, for example, power consumed by the transmitter, the vibration actuator, the analog to digital converters, the processors, the speakers, etc. The battery monitoring data 228 may be relayed to the metering software 104 by a battery monitoring unit within a portable device. Many portable devices include battery meters, enabling the metering component 104 to poll the battery monitoring unit for energy consumption data. This may include software polling and receiving a message containing battery statistics, and/or polling a battery hardware component and receiving parametric data. Additionally, the metering component 104 may contain hardware and/or embedded software manufactured and integrated in the portable device for more accurate battery data and/or additional battery parameters.

The collection system 102 included within the example metering and collection system 200 may be part of a third party metering service. The event log memory 204, the data processor 206, the data analyzer 208, and the database 210 may be communicatively coupled within the collection system 102 and/or may physically be located in multiple, separate locations and communicatively coupled together. In the illustrated example, the event log memory 204 stores event logs transmitted from one or more of the metering components 104 within portable devices. The event logs may be arranged or organized by panel member, device type, time period, etc.

The data processor 206 filters and process the event logs within the event log memory 204. For example, the metering service may decide to calculate event energy consumption for a device type such as, for example, the Motorola RAZR™. The data processor 206 accesses the event log memory 204 and retrieves event logs with a Motorola RAZR™ device type identification field. In another example, a metering service may decide to calculate the energy consumption of an application such as, for example, a "Monkeys in the Park" game. The data processor 206 retrieves the event logs that include a game application in which a game metadata attribute includes "Monkeys in the Park." The data processor 206 then sends the filtered event logs to the data analyzer 208 to calculate the energy consumption of the "Monkeys in the Park" game. Additionally, the data processor 206 may delete event logs that exceed a time to keep parameter and/or organize the event logs within the event log memory 204 as requested by the metering service. Organizing the event log memory 204 may include counting the number of event logs, counting the number of event logs from a specific device, and/or device type, counting the number of application types and/or hardware function types, grouping similar device types, grouping event logs according to panel member, grouping event logs according to demographic information, etc. The data processor 206 may also include sorting through collected data to ascertain demographic profiles of panel members and related location/market information. The data processor 206 may also be configured to process event logs automatically. For example, the data processor 206 may process event logs at a specified time of the month and/or week, when the event log memory has reached a predefined fullness value, when a specified device or event sample size is reached, etc. The filtered and/or processed event logs and/or data are sent to the data analyzer 208.

The data analyzer 208 included within the collection system 102, analyzes information from the event logs and/or data sent by the data processor 206. This includes energy consumption per event type for a time period, usage statistics, service functionality, network performance metrics, device performance metrics, etc. For example, the data processor 206 may send two hundred event logs from panel members with a Motorola RAZR™ portable device to the data analyzer 208. The event logs may contain a time period of events including applications used, the length of time the applications were used, the metadata associated with the applications, the corresponding hardware functions implemented by the applications, and the total energy consumed by the portable device in the time period. During the time period event data was collected, more than one application and/or hardware function may have been operating, eliminating the possibility of associating energy consumption measurements with a single event. To determine the energy consumed by each application and/or hardware function, the data analyzer 206 is configured to calculate event energy consumption from a plurality of event logs. The event logs may be structured into corresponding linear equations that the data analyzer 208 uses to solve for the energy consumption per event.

In one particular example, over a two hour time period, the metering component 104 monitors a cellular telephone portable device. The portable device has five applications and/or hardware functions including a phone application, a game application, a camera function, an operating system, and the metering component 104. During this time, 209 seconds are spent talking on the portable device, 1509 seconds are spent playing a game, and 14 pictures are taken with a built-in camera. Additionally, for the entire 7200 seconds, the operating system is on and the metering software within the metering component 104 is running During the two hour time period, the metering component 104 measured the total energy use to be 4295 joules. The event data or, more generally, the metered portable device information, is stored to an event log in an event log cache on the portable device and is transmitted via the transmission medium 218 to the event log memory 204. This event log is chosen by the data processor 206 and sent to the data analyzer 208. The data analyzer 208 deconstructs the event log data into coefficients (e.g., 209, 1509, 14, 7200, 7200) corresponding to the metered portable device information. The total energy consumed for each event is found by multiplying the coefficient by a variable associated with the event type energy use per second. A variable is assigned to the energy consumed for each event, $x_1$ for the phone, $x_2$ for the game, $x_3$ for the camera, $x_4$ for the operating system, and $x_5$ for the metering software. The data analyzer 208 then represents the total energy per event as a linear equation of the form:

$$209x_1 + 1509x_2 + 14x_3 + 7200x_4 + 7200x_5 = 4295$$

In this example, the total energy consumed by talking on the phone is the 209 seconds multiplied by energy consumed per second talking on the phone, $x_1$. The total energy consumed by playing a game is the 1509 seconds multiplied by the energy consumed per second of playing a game, $x_2$. The total energy consumed by the camera is the 14 pictures multiplied by the energy consumed by taking a picture, $x_3$. The total energy consumed by the operating system is the 7200 seconds multiplied by the energy consumed per second running the operating system, $x_4$. The total energy consumed by the metering software is the 7200 seconds multiplied by the energy consumed per second running the metering software, $x_5$. The data analyzer 208 constructs six or more similar linear equations with the same five variables from event logs to solve for the five variables using an over-determined linear least squares fit technique. The data analyzer 208 solves for the five variables and returns, for example, $x_1 = 0.7697$, $x_2 = 1.5476$, $x_3 = 19.2216$, $x_4 = 0.1985$, and $x_5 = 0.0377$.

In this example, the total energy consumed by talking on the phone is the 209 seconds multiplied by the energy use per second of 0.7697 watts, or 160.8673 joules. If the individual energy usages are summed, the total calculated energy use is 4466 joules, which results in a difference or error term of 171 joules when compared to the actual measured energy usage of 4295 joules. The data analyzer 208 may improve the accuracy of the data by deleting linear equations with the highest error term from the energy usage analysis. A recalculation of a least squares fit of the remaining linear equations may produce variables with the values $x_1 = 0.7277$, $x_2 = 1.3112$, $x_3 = 19.6202$, $x_4 = 0.2272$, and $x_5 = 0.0431$. The total calculated energy use is 4351.5329 joules, or 1.28% different (i.e., greater) than the total measured energy use of 4295 joules. The data analyzer 208 may then report the calculated variable values to the database 210.

In another implementation, the data analyzer 208 loads event logs that include clock cycle speed, number of clock cycles metered for each event over a two hour time period on a portable device, and the total energy consumption over the two hour time period. The data analyzer 208 may normalize the energy consumed by the clock cycle speed. A linear equation can then be constructed in the same manner as the previous example, wherein the event usage time coefficients are replaced with the number of clock cycles counted per event type. The resulting calculation determines the energy consumed per event type per clock cycle.

In addition to energy consumption calculations, the example data analyzer 208 analyzes the event logs to determine trends in usage behavior of panel members or aggregating groups of panelists including but not limited to metrics such as market share of calling, web browsing, text messaging, e-mail, and secure transactions; analyzing peak/off peak usage patterns of panel members as well as average usage days per given period of time; analyzing telephony metrics including, for example, call duration, incoming versus outgoing calls, local versus long distance, calls, voicemail functions, and digital versus analog mode; analyzing wireless data/Internet metrics including, for example, reach (percentage of users who visit a particular website during a given time period), unique visitors (number of web-active individuals who visited a particular website or web property within a given time frame), top sites or URLs visited during a given period of time, top sites bookmarked, counts of secure transactions placed during a given time period, visits to non-web digital media sites over a given period of time, click streams, advertisement views and responses; analyzing functionality of various wireless voice, and data/Internet services provided to users whereby number of hits per site or application versus total offerings may provide such indication; analyzing performance metrics related to the device, including but not limited to keypad operation, CPU processing capabilities, RF calibration, transmit and receive power, power consumption, battery charging, voltage, current and temperature; and analyzing performance metrics related to the operators' networks, including but limited to RSSI (received signal strength indication), access failures, finger assignments, handoff and cocoder activity, transmit and receive power, frame error rates, dropped calls, block calls, connection speeds, Internet or web applications download speeds, and secure transaction speeds.

The database 210 included within the collection system 102 of FIG. 2 stores calculated data from the data analyzer 208. The database 210 may additionally use the calculated data to generate reports that can be used for marketing information products including energy consumption for applications products, energy consumption of portable devices products, energy consumption for hardware functions on portable devices products, network performance products, device performance products, and integrated products that are useful to network operators, advertisers, content providers and producers of portable devices, and data services and products. The marketing information can, for example, be used by hardware developers, application developers, and portable device manufactures to guide future product development. For example, a report may indicate the game, "Monkeys in the Park," consumes significantly more energy on portable devices that use a specific chip set. The game developers could use the energy consumption for applications report to identify areas for improvement to the code of the game to reduce the energy consumed by games played on portable devices with that specific chip set or similar chip sets. The marketing products and/or reports may be automatically generated by the database upon receipt of calculated data from the data analyzer 208, or may be generated by the metering service. Examples of marketing reports are described in further below in FIGS. 7A and 7B.

Figure 3:
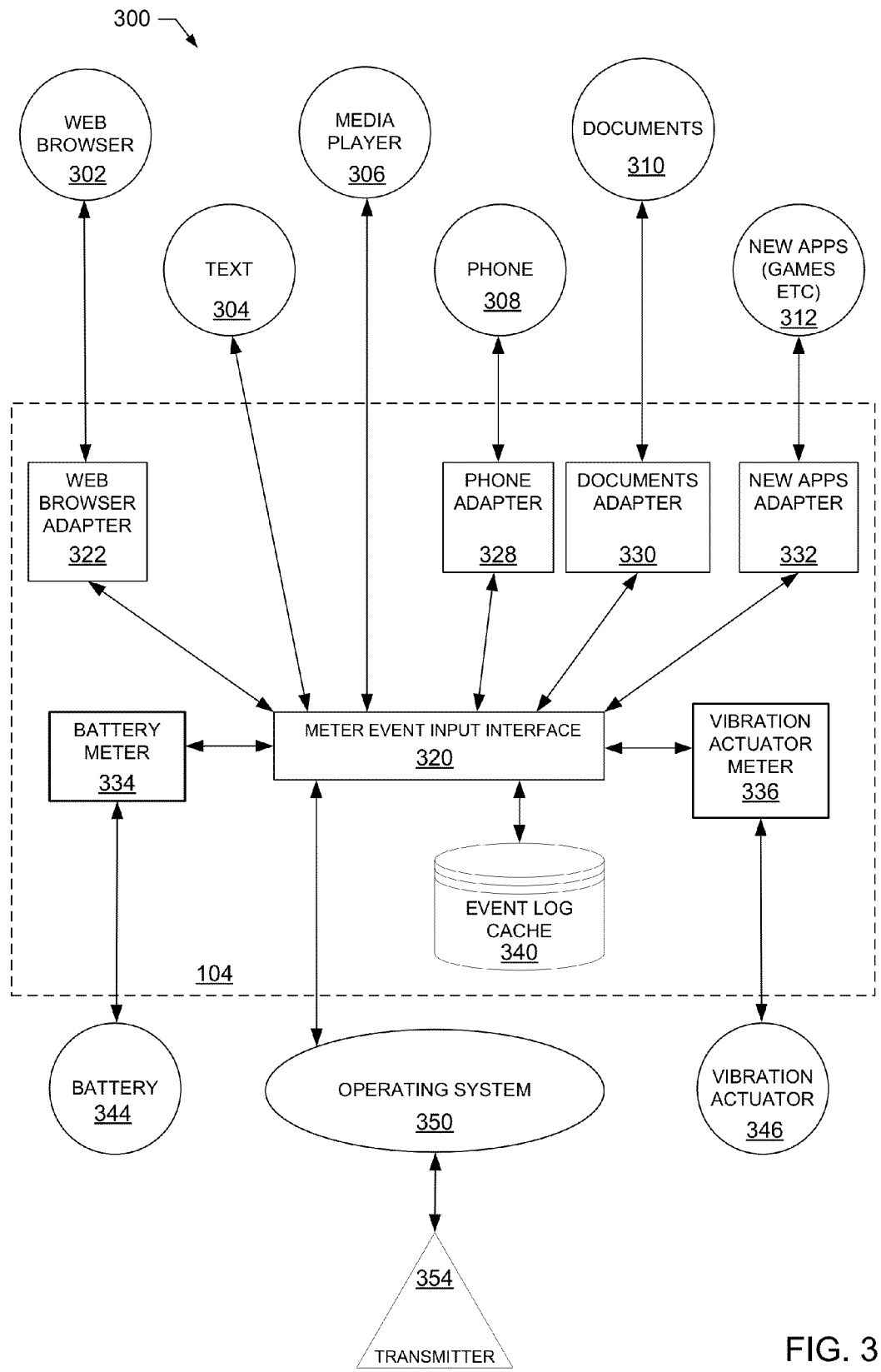
FIG. 3 shows a functional block diagram of an example portable device including the metering component of FIG. 1, applications, hardware, an operating system, and a transmitter.

FIG. 3 shows a functional block diagram of an example portable device 300 including the metering component 104 of FIG. 1, applications 302-312, hardware 344-346, an operating system 350, and a transmitter 354. The metering component 104 includes application adapters 322-332, hardware meters 334-336, a meter event input interface 320, and an event log cache 340. The metering component 104 may be stored within the portable device 300 on a software medium, within a memory medium accessed by the operating system 350, embedded within a ROM and/or operating system, and/or included within a metering hardware component, such as an ASIC, installed during the manufacture of the portable device 300.

While FIG. 3 shows an example manner of implementing the metering component 104, one or more of the functional blocks, processes and/or devices illustrated in FIG. 3 may be combined, divided, re-arranged, omitted, eliminated and/or implemented in any other way. Further, the example metering component 104 may be implemented by hardware, software, firmware and/or any combination of hardware, software and/or firmware. Thus, for example, any component of the example metering component 104 could be implemented by one or more circuit(s), programmable processor(s), application specific integrated circuit(s) (ASIC(s)), programmable logic device(s) (PLD(s)) and/or field programmable logic device(s) (FPLD(s)), etc. The metering component 104 may include one or more elements, processes and/or devices in addition to, or instead of, those illustrated in FIG. 3, and/or may include more than one of any or all of the illustrated elements, processes and devices.

In the example implementation of FIG. 3, the metering component 104 is located within the portable device 300. Alternatively, in other example implementations the metering component 104 may be exterior to or remotely located relative to the portable device 300, but communicatively coupled to the portable device 300. In this example, the metering component 104 can be attached to the portable device 300 and/or included within a personal computer communicatively coupled to the portable device. The metering component 104 can be configured for each type of portable device. For example, wireless cellular portable devices with a SET A of applications may receive metering component A, wireless cellular portable devices with a SET B of applications may receive metering component B, while laptops with a SET C of applications may receive metering component C. Alternatively, the metering component 104 may configure itself during installation within the portable device 300. For example, during installation, the metering component 104 may determine the number and types of applications on a portable device, and configure the corresponding application adapters.

The application adapters 322-332 included within the metering component 104 are configured to monitor the corresponding application without causing a deviation or degradation in performance of the monitored application. The application adapters 322-332 are initiated when the application is opened by a panel member on the portable device 300. The application adapters 322-332 monitor and capture events and their corresponding attributes by polling the applications for metering information, and/or inspecting application files, and/or application software code for metering information. For example, the web browser adapter 322 monitors the instances a panel member launches the web browser, the web sites visited, the duration of using the web browser, and the duration at each site. The example portable device 300 shows six applications 302-312 and the corresponding application adapters 322-332. However, alternative portable devices may include more or fewer applications and corresponding application adapters. The applications may include any of the applications described above in conjunction with FIG. 2.

The text application 304 and the media player application 306 do not have respective application adapters. They are configured to report metered event information directly to the meter event input interface 320, as described in U.S. Pat. No. 6,353,929 which is hereby incorporated by reference in its entirety. Application developers may cooperate with a metering service, such as Nielsen Mobile™, to incorporate metering components within an application. For example, a media player may be configured to report metadata, usage time, and/or device parametric data such as, for example, volume, tone, clock cycles, and/or file format directly to the meter event input interface 320.

The hardware meters 334-336 monitor and store data corresponding to hardware functions. In the example, the battery meter 334 monitors the battery 344 and the vibe meter 336 monitors the vibration actuator 346. The battery meter 334 is configured to measure energy consumption within the battery 344 by measuring battery voltage, current, internal resistance, accumulated current, temperature, and/or age. The vibe meter 336 is configured to monitor the length of time the vibration actuator 346 is actuated, the intensity of the actuation, etc. The hardware meters 334 are contained within software that receives information from hardware components within the portable device 300 such as, for example, a battery monitoring circuit. Additionally and/or alternatively the hardware meters may be embedded within the hardware components to report metering information to the meter event input interface 320. In other implementations the portable device 300 may contain more or fewer hardware functions and corresponding hardware meters. The hardware functions may include any of the hardware functions described above in conjunction with FIG. 2.

The meter event input interface 320 receives the metered information from the application adapters 322-332, applications 304-306, and the hardware meters 334-336, and organizes the data into an event log. An example structure of the event log is described in further detail in FIG. 4A. The meter event input interface 320 saves the event log to the event log cache 340. The meter event input interface 320 collects and organizes the information at the end of a metered event time period. Alternatively, the application adapters 322-332 may send the metered portable device information during the metered time period. Additionally, the meter event input interface 320 requests collected information from the application adapters 322-332 and applications 304-306. In the example, the application adapters 322-332 and applications 304-306 collect data during specific time periods dictated by the metering component 104. Outside of this time period, the application adapters 322-332 remain in an off state. In another example implementation the application adapters 322-332 may continuously monitor the applications wherein and the meter event input interface 320 collects information from the application adapters 322-332 and applications 304-306 during the specified time periods.

The event log cache 340 receives and stores event logs from the meter event input interface 320. The event log cache 340 stores event logs until the event logs are transmitted to the collection system 102. The event log cache 340 may be a part of the RAM and/or any other memory component of the portable device 300. Additionally, the event log cache 340 may be a separate memory chip installed during manufacture of the portable device 300. In other example implementations the event log cache 340 may be exterior to the portable device 300, such as in a portable memory device (e.g., a SD card), or within a personal computer communicatively coupled to the portable device 300.

The operating system 350 included within the portable device 300 manages the operation of the portable device 300. This includes operating the applications 302-312, interacting between the applications 302-312 and the hardware functions 334-336, ordering event processing on a processor, saving event information to memory, coordinating data transfer from I/O devices, and/or operating the meter event input interface 320 in the background of the applications 302-312. Additionally, the meter event input interface 320 collects information from the operating system 350, including the number of clock cycles needed to run an application, parametric device information, etc. In the example, the meter event input interface 320 sends the event logs from the event log cache 340 to the operating system 350 and the operating system 350 sends the event logs to the transmitter 354 for transmission to the collection system 102.

The transmitter 354 included within the portable device 300 enables the transfer of event logs to the collection system 102. The transmitter 354 may be an integrated circuit and antenna configured to transmit data wirelessly. The transmitter 354 may adhere to the wireless standards described in FIG. 1. Alternatively, the transmitter 354 may be a driver such as for example, a USB driver to transmit data via a hardwired medium to a personal computer.

Figure 4A:
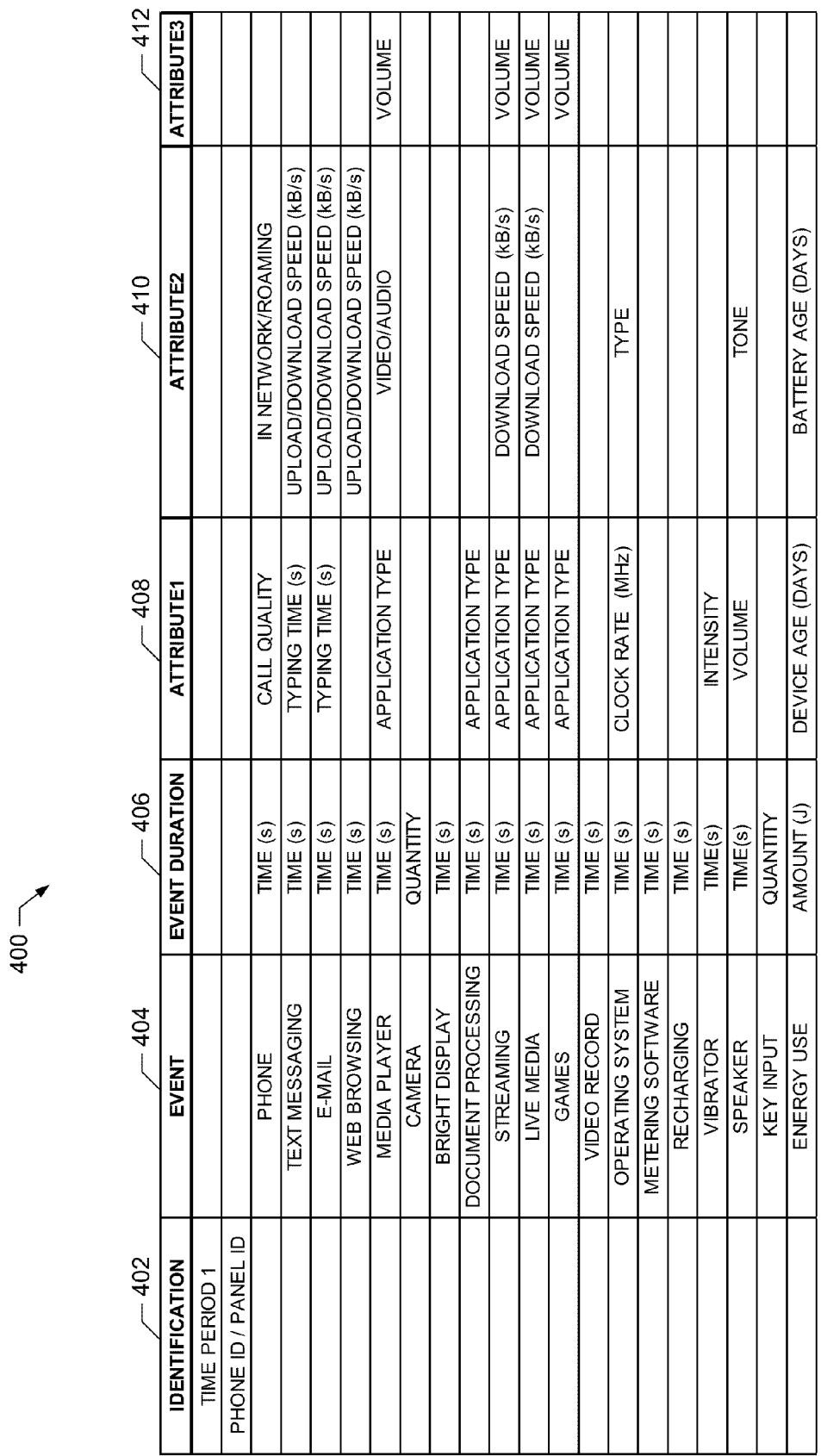
FIG. 4A shows a table of an example event log data structure format including an identification field, an event field, an event duration field, and attribute fields.

FIG. 4A shows a table of an example event log 400 data structure format including an identification field 402, an event field 404, an event duration field 406, and attribute fields 408-412. An event may be added to the event log 400 by the meter event input interface 320 upon notification from an application adapter, or hardware meter indicating an event has initiated. The event log 400 is shown in an example structure; additionally or alternatively the event log 400 may be configured in a hierarchical structure, a tree structure, and/or any other data organization structure. The identification field 402 contains a section for the time period of the data collection, the phone identification and the panel member identification. The phone identification may include the brand and model type of the panel member's portable device. The panel member identification may include an alpha-numeric code provided to the panel member when their portable device is registered to a metering service. The event field 404 includes a list of possible events on a portable device. These include but are not limited to applications such as, for example, phone, text messaging, e-mail, etc. The hardware functions include battery monitor (ENERGY USE), bright display, vibration actuator, speaker, key input, etc.

In the example implementation, the event duration field 406 records the time spent using the application and/or the hardware function during a time period. The data may include time data and quantity data. For example, a camera application may be counted by number of pictures taken while the media player is metered by the length of time it is used. The attribute fields 408-412 contain additional data associated with the events. This may include network parametric data, device parametric data, metadata, etc. In this example, there are three attribute fields. In other example implementations the event log 400 may contain more or fewer attributes. The attribute data is used by the data processor 206 to filter event logs, by the data analyzer 208 to calculate, and/or normalize data, and/or the database 210 to provide additional information associated with the calculated data. For example, the SPEAKER event includes attributes for VOLUME and TONE. Energy consumption of the speaker may depend on the volume and/or tone level. If the database 210 is generating a report for average energy consumption of a portable device, it may include within the speaker data the average volume and tone used by the portable devices. This shows the operating conditions of the speaker during which data was collected to calculate the average energy consumption. In another example, the data processor 206 filters event logs with extreme volume levels to remove outlying data points. In yet another example, the battery age is used to filter event logs with very old or very new batteries, as battery performance changes over time. Additionally, the attribute data may be used by the data analyzer 208 to formulate statistics regarding network performance, device performance, market share, application use, etc. One or more attributes associated with the hardware function may meter a device parametric such as the volume of a speaker. The event log 400 may store the attribute data as a normalized decimal value instead of the hardware parametric. For example, the volume setting of a portable device may be 2.4 volts, which may be normalized to a volume setting of 3.

Figure 4B:
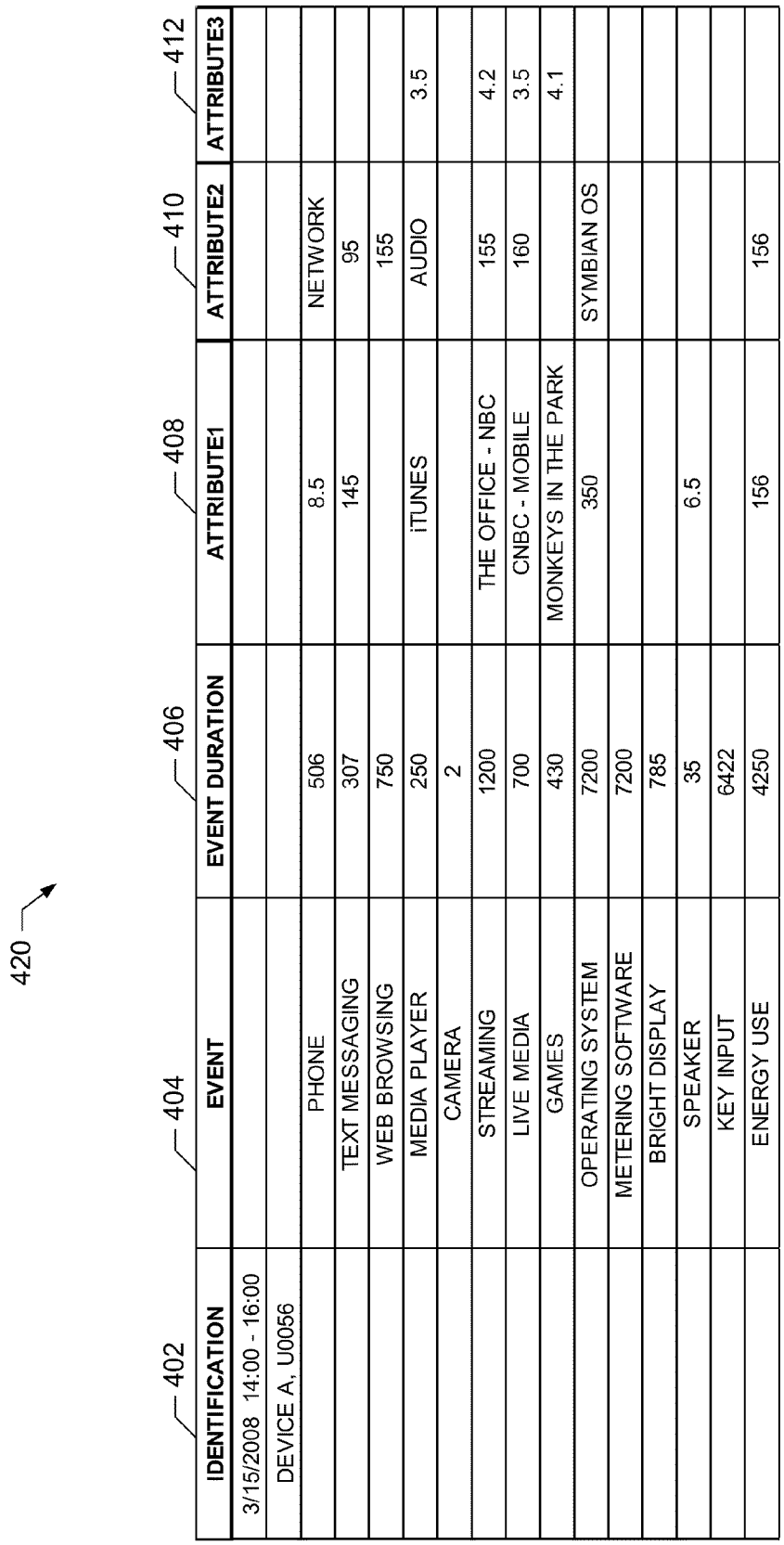
FIGS. 4B-4C show tables of example event logs including the identification field, the event field, the event duration field, and attribute fields of FIG. 4A.
Figure 4C:
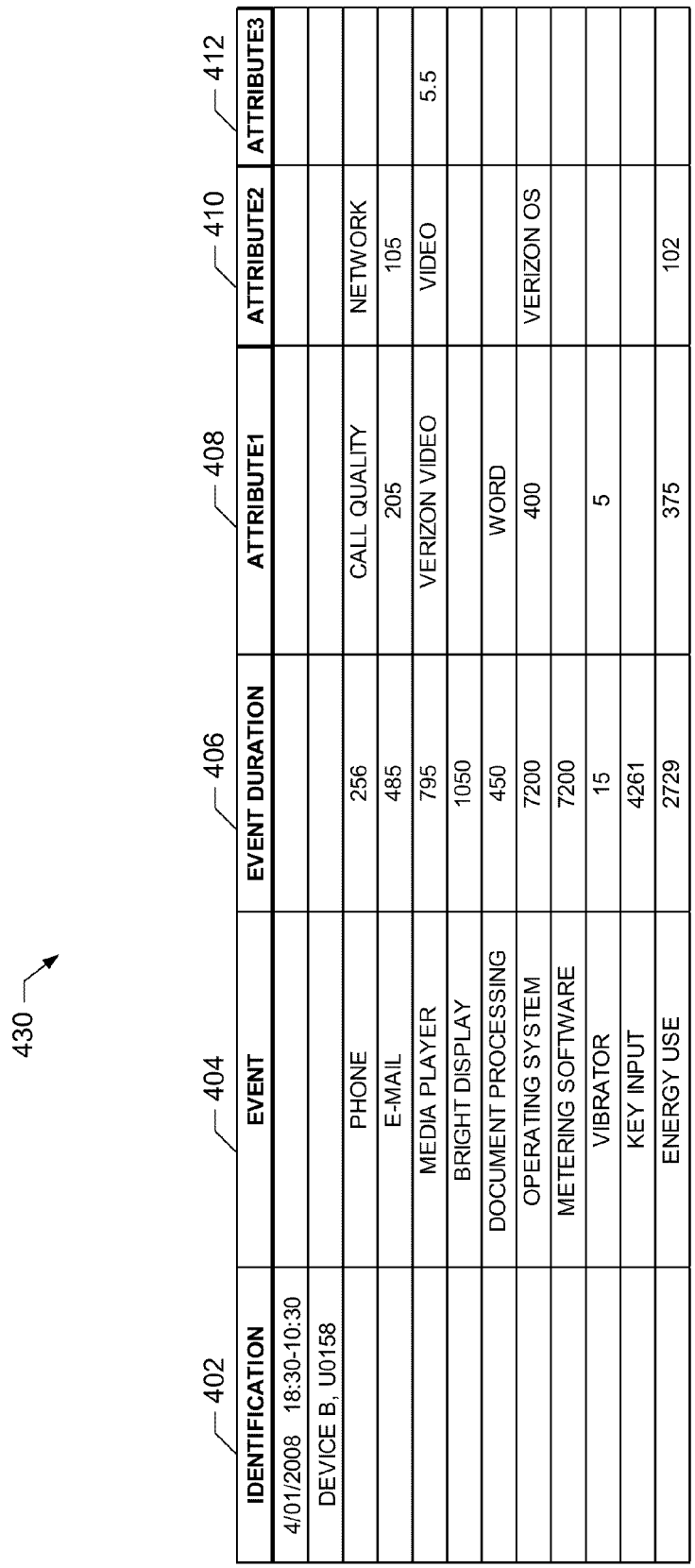

FIGS. 4B-4C show tables of example event logs 420 and 430 including the identification field 402, the event field 404, the event duration field 406, and the attribute fields 408-412 of FIG. 4A. The example event logs 420 and 430 may be constructed by the meter event input interface 320 and saved to the event log cache 340 in the format of the example table. The example event logs 420 and 430 depict event data from two different devices and two different panel members. The event logs 420 and 430 include the applications and hardware functions that were used by the panel members within the metered time period. The events include event duration data and corresponding attributes.

More specifically, the event log 420 in FIG. 4B shows application and hardware function data gathered for a two hour time period on DEVICE A associated with panel member U0056. The data was collected on Mar. 15, 2008 from 14:00-16:00. During this time period, the U0056 panel member used the phone for 506 seconds, used the text message application for 307 seconds (during which 145 seconds were spent typing), browsed the web for 750 seconds, used the media player for 250 seconds, took two pictures with the camera application, steamed data for 1200 seconds, used the live media application for 700 seconds watching CNBC™, and played the game, "Monkeys in the Park," for 430 seconds. In addition, the operating system and metering software were operating for the entire two hours. The applications used the bright display hardware function for 785 seconds, the speaker for 35 seconds, 6422 key inputs (e.g., button presses) and consumed 4250 joules from the battery during the two hours.

The event log 430 in FIG. 4C shows application and hardware function data gathered for a two hour time period on DEVICE B associated with panel member U0158. The data was collected on Apr. 1, 2008 from 18:30-20:30. During this time period, the panel member U0158 used the phone for 256 seconds, used the e-mail application for 485 seconds, during which 205 seconds were spent typing and an upload speed of 105 kB/s, used the media player for 795 seconds using a proprietary VZW VIDEO player, and used a document processing application for 450 seconds. In addition, the operating system and metering software were operating for the entire two hours. The applications used the bright display hardware function for 1050 seconds, the vibration actuator for 15 seconds with an average intensity of 5, 4261 key inputs (e.g., button presses) and consumed 2729 joules from the battery during the two hours. The average intensity value may be normalized to a decimal value on a linear scale such as, for example, a value between 0 and 10.

FIG. 5 shows a table of an example event log compiler table 500 constructed by event logs by the data analyzer 208 of FIG. 2. The event log compiler table 500 includes a user identification field 502, an event data section 504, and an energy use field 506. The event log compiler 500 contains event information and energy consumption data from a plurality of panel members using a device type of DEVICE A with the same event types. The user identification field 502 includes the identification codes of the panel members. The row associated with each member's code includes the time each application and hardware function was used and the total energy consumed in the time period. In this example, the data processor 206 may have filtered event logs in the event log memory 204 with DEVICE A and a two hour time period in the identification filed 402. The filtered event logs were then constructed into the event log compiler table 500 by the data analyzer 208. For example, the event log 420 in FIG. 4B is the first row within the event log compiler table 500. The times and event quantities within the event duration 406 are populated in the event data section 504 and the energy use field 506.

The METER field in addition to the other event fields except the operating system (OS) has values of 1800 and 3600 seconds respectively for users U0256 and U0056 ($2^{nd}$ instance). These values result from the metering service disabling the continuous monitoring of the metering component 104 during one or more metered time periods in order to create a usage time difference between the METER and the OS. If the metering component 104 and the OS were constantly running for the same time in every event log, the energy use by the OS and the metering component 104 would by linearly dependent. In other words, a least squares fit of the energy consumption results in the energy consumption of the OS and METER summed together for one field (e.g., METER) while the other field results in a 0 (e.g., OS). To correct this linear dependence, the metering component 104 in this example was deactivated for a portion of the metered time period for two event logs (e.g., U0256 and U0056 $2^{nd}$ instance). The period may be determined to be one in which the portable device was in an idle state for a portion of the time period. Thus, if the portable device was in an idle state for a portion of the time period, the metering component 104 would not miss an event while it was deactivated. Then, when the portable device is removed from the idle state, the metering component 104 is reactivated to record the new events. In another example implementation, the OS and/or events may be configured to include record usage times during a time period. Subsequently, at the end of a metered time period, the usage times are sent to the metering component 104 to store within an event log.

FIG. 6 shows a matrix equation of an example energy consumption matrix equation 600 constructed from the event log compiler table 500 of FIG. 5. The energy consumption matrix equation 600 includes an event matrix 602, a variable matrix 604, and an energy use matrix 606. The data analyzer 208 of FIG. 2 creates the energy consumption matrix equation 600 by formulating linear equations from the event log compiler table 500 of FIG. 5 and structuring the linear equations into a matrix format to solve for event energy consumption variables.

For example, the user identification U0056 in the first row in FIG. 5 shows the event usage time within the event data section 504 and the total energy consumption in the energy use field 506. In order to determine the energy consumed for each event, the data analyzer 208 may construct the row into a linear equation:

$$506x_1+307x_2+0x_3+750x_4+250x_5+2x_6+785x_7+0x_8+1200x_9+700x_{10}+430x_{11}+0x_{12}+7200x_{13}+7200x_{14}+0x_{15}+6422x_{16}=4250$$

where $x_1$ corresponds to the phone application, $x_2$ corresponds to the text application, $x_{16}$ corresponds to the key input hardware function, etc. The total energy consumed by the phone application is the 506 seconds multiplied by the energy consumption per second for using the phone (i.e., $x_1$). To solve for the 16 variables corresponding to the event type, the data analyzer 208 constructs similar linear equations from the other rows in the event log compiler table 500 using the same variables as the first equation. To solve the 16 variables the data analyzer 208 constructs the energy consumption matrix equation 600 from the plurality of linear equations. The coefficients of the linear equations are placed into the event matrix 602, the corresponding variables are constructed into the variable matrix 604, and the metered energy use for each linear equation is constructed into the energy use matrix 606. To satisfy the conditions for an over-determined least squares fit, the data analyzer 208 requires 16 or more linear equations to solve for the 16 variables corresponding to the 16 events. The least squares fit calculation results in a value for each one of the 16 variables. The resulting value corresponds to the energy use per second for the event type. In this example, if $x_2$ was determined to be 0.7365 joules, this would indicate the text messaging application consumes 0.7365 joules per second when used by a panel member on DEVICE A.

FIGS. 7A-7B show tables of example energy consumption reports 700 and 710 including a summary statistics section 702, and event result sections 704 and 706. The energy consumption reports 700 and 710 may be constructed by the database 210 of FIG. 2 from the calculated data from the data analyzer 208. The energy consumption reports 700 and 710 both contain a summary statistics section 702 that contains general information including device type, total number of devices per device type metered, and the average measured energy use per device over a two hour time period. In another example, the summary statistics section 702 may include additional information, including network service provider, panel member demographic information, etc.

The energy consumption report 700 of FIG. 7A includes energy consumption per application type for four device types and includes the summary statistics section 702, and a application results section 704. The 'n/a' within the CAMERA and VIDEO RECORD fields for DEVICE C indicate the device did not contain a video capturing application. In this example, the energy consumption per application type varies by application in addition to device type. For example, the phone application consumed 0.7697 joules per second on DEVICE A while the phone application consumed 0.6515 joules per second on DEVICE B. The application description within the application results section 704 may provide additional information, such as device parameter data, average event use, application name, etc. For example, the WEB application may include the web browser type used (e.g., Internet Explorer™, FOXFIRE™, VCAST™), the average usage time of the web browser per panel member, the top five sites visited, the average data transfer speed, and/or the wireless network accessed by the device.

The energy consumption report 710 of FIG. 7B includes energy consumption per hardware function type for four device types and includes the summary statistics section 702, and a hardware results section 706. In this example, the energy consumption per hardware function type varies by application in addition to device type. The hardware function description within the hardware results section 706 may provide additional information, such as device parameter data, average event use, hardware component manufacturer, etc. For example, the metering service may keep a database of hardware components included in the portable device. When the portable device reports the energy consumption and the event usage, for example, the camera, the metering service would know the hardware manufacturer, camera component type, and/or model number enabling the energy consumption report to include the energy consumption per hardware component type.

The reports may be used for marketing information products including, energy consumption for applications products, energy consumption of portable devices products, energy consumption for hardware functions on portable devices products, network performance products, device performance products, and/or integrated products. The marketing information may be used by hardware developers, application developers, and portable device manufactures to guide future product development. The reports may be used by consumers to highlight energy use per device type and/or application type. For example, a consumer considering the purchase of a new application for his portable device may consult with a report to view the energy consumption of the desired applications for his portable device. Software developers may use the reports to benchmark how their current software applications consume energy on portable devices. They may study examples of high energy consumption to determine which sections of code, and/or interactions with hardware lead to the increased consumption and devise improvements. The improvements may be released as software patches to the current software and/or incorporated into future software applications. The reports may also assist developers to consider energy consumption in developing software and/or hardware.

In another example, the reports may be used by portable device manufactures and/or included in updates to the metering component 104 to predict battery life within a portable device based on the events currently being used by a panel member. A panel member may be using a portable device for web browsing. The metering component 104 may contain the energy consumption per second for the web browser and can calculate the approximate battery life remaining based on metered battery information and the current events in use including the web browser. The metering component 104 may then send a message to the display of the portable device indicating the remaining battery life.

FIGS. 8, 9A, 9B, and 10 are flowcharts representative of example methods of processes that may be performed to meter and analyze energy consumption data and event information within portable devices to determine energy consumption per event type. The example methods may be implemented using machine readable instructions, code, software, etc. that is executed using, for example, a processor system such as the system 1100 of FIG. 11. However, the one or more of the blocks depicted in the flowcharts may be implemented in any other manner, including dedicated purpose circuitry, manual operations, etc. Additionally, although the example methods are described with reference to the flowcharts of FIGS. 8, 9A, 9B, and 10, other methods to meter and analyze energy consumption data and event information within portable devices to determine energy consumption per event type may additionally or alternatively be used. For example, the order of execution of the blocks depicted in the flowcharts of FIGS. 8, 9A, 9B, and 10 may be changed, and/or some of the blocks described may be rearranged, eliminated, or combined.

Figure 8:
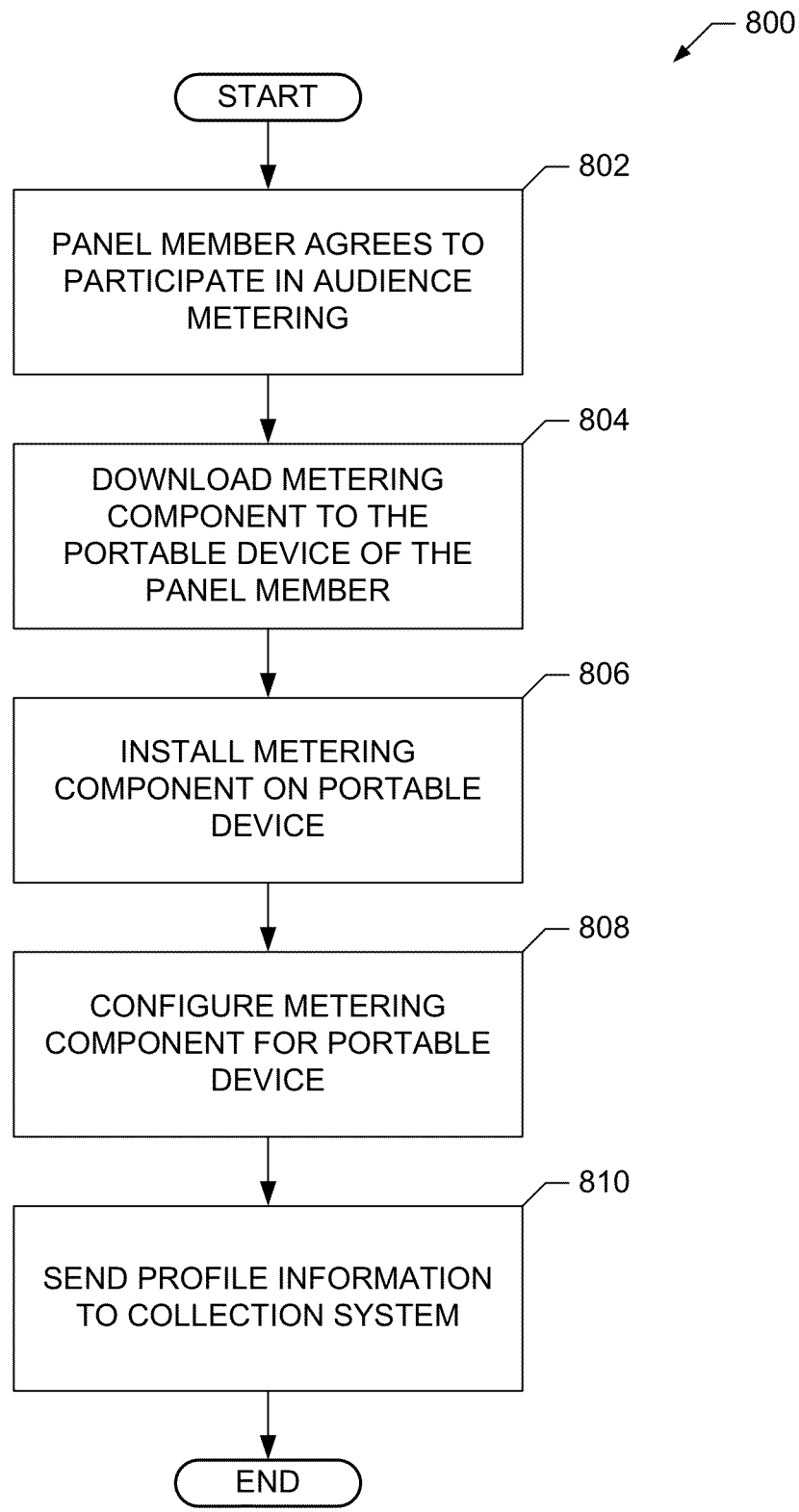
FIG. 8 is a flow chart illustrating an example method for installing and configuring the metering component used with the example systems of FIGS. 1-3.

In particular, example method 800 of FIG. 8 may be performed to implement the example metering component 104 and/or the collection system 102 of FIG. 1. The example method 800 may be executed at predetermined intervals, based on an occurrence of a predetermined event, etc., or any combination thereof. For example, the method 800 may be executed in a portable device including the metering component 104 and/or within the collection system 102, at predetermined intervals, such as hourly, daily, etc. Additionally or alternatively, the example method 800 may be executed upon the occurrence of a trigger generated remotely such as, for example, on a portable device when a panel member registers and/or agrees to download and/or install the metering component 104.

The method 800 begins at block 802 when a panel member registers and/or agrees to participate in the metering of energy consumption and events on their portable device. The panel member may register by visiting the metering service website to enter the portable device and/or demographic information, may respond to a solicited and/or unsolicited communication from the metering service asking the panel member to participate in the metering survey, and/or a panel member may agree to a request from a preinstalled metering component 104 that prompts the panel member to participate in the metering survey. Registering may also include the panel member indicating the type of their portable device so that the corresponding metering component 104 may be installed. Once the panel member agrees to have his portable device metered, control proceeds to block 804 where the metering component 104 is downloaded to and installed on the portable device. This may also include manually attaching the metering component 104 to the portable device. Then, in block 806, the metering component 104 is installed onto the portable device (e.g., a memory stick). This includes the portable device running an installation program associated with the metering component. Additionally or alternatively, this may include installing any hardware components of the metering component 104 within the portable device.

Control then proceeds to block 808 where the metering component 104 is configured within the portable device. This includes setting up one or more application adapters and/or hardware meters for the corresponding applications and/or hardware functions within the portable device, creating connections between the application adapters and/or hardware meters to the meter event input interface 320, allocating and/or creating space within the device memory for the event log cache 340, polling applications and/or hardware functions for metering capability, etc. In another example, the configuration may include configuring the metering component 104 to relay metered information to a personal computer. Once the metering component 104 had been configured, control proceeds to block 810 where the metering component 104 sends profile information to the collection system 102. This may include the identification information of the portable device, including a model and serial number, the type of applications and/or hardware functions the metering component 104 is configured to meter, panel member demographic information, etc. Once the collection system has received the profile information from the metering component, the method 800 for installation and configuration of the metering component 104 ends.

Figure 9A:
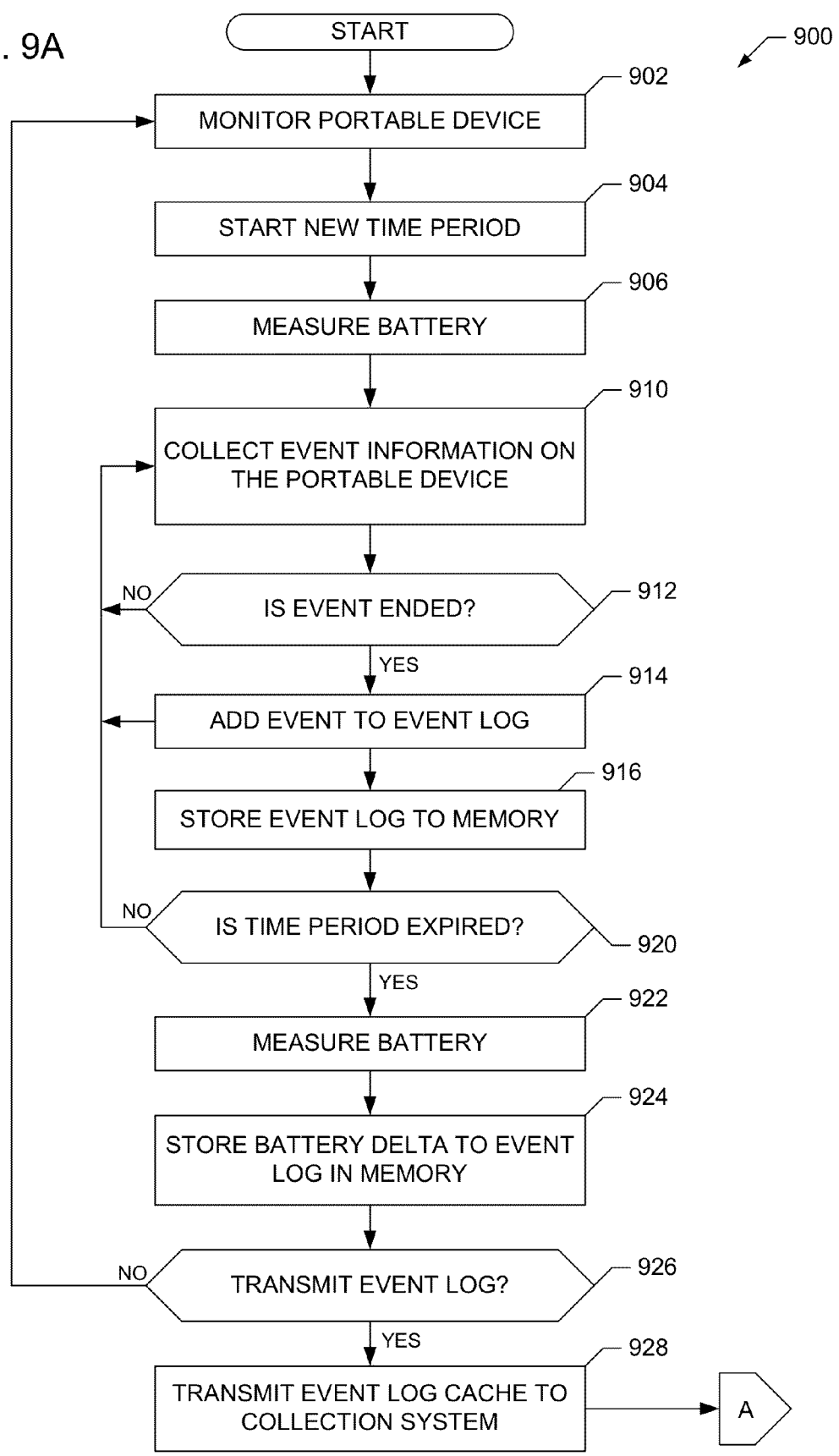
FIG. 9A is a flow chart illustrating an example method for collecting and storing event information and energy consumption data on a portable device.
Figure 9B:
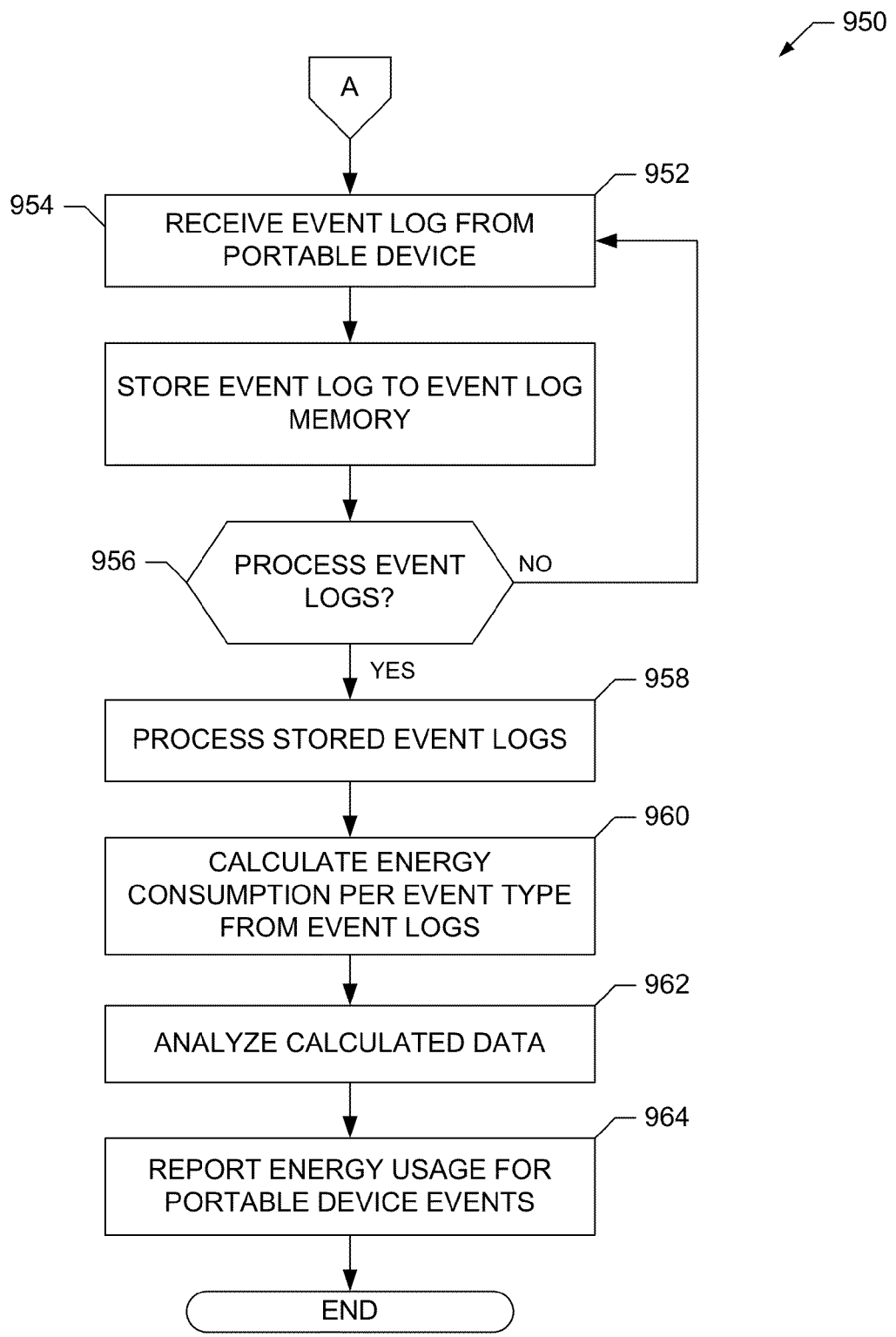
FIG. 9B is a flow chart illustrating an example method for receiving, processing, and analyzing event logs from portable devices.

Example methods 900 and 950 of FIGS. 9A-9B may be performed to implement the example metering component 104 and/or the collection system 102 of FIGS. 1-3. The example methods 900 and 950 may be executed at predetermined intervals, based on an occurrence of a predetermined event, etc., or any combination thereof. For example, the method 900 may be executed in a portable device including the metering component 104 while method 950 may be executed within the collection system 102 at predetermined intervals, such as hourly, daily, etc. Additionally or alternatively, the example method 900 may be executed upon the occurrence of a trigger generated remotely such as, for example, on a portable device when the metering component 104 is initiated. Similarly, the example method 950 may be executed upon the occurrence of a trigger generated remotely such as, for example, on the collection system 102 when event logs are transmitted from one or more portable devices.

The method 900 begins at block 902 when a metering component 104 begins to monitor a portable device. Then, in block 904, a new time period begins for metering events. The indication to start a new time period may be received by the metering component 104 from the collection server 102 and/or the schedule of time periods may be included within software for the metering component 104. Upon the start of a new metering time period, control proceeds to block 906 where the battery meter 334 of FIG. 3 measures one or more characteristics associated with the battery including, voltage, current, accumulated current, internal resistance, temperature, current charge state, etc. The characteristics may be used by the meter event input interface 320 to calculate the current energy level of the battery. Next, in block 910, the metering component 104 collects event information on the portable device. This includes application information gathered by the application adapters, hardware functions from hardware meters, and/or direct metering information from the applications and/or hardware. The collection of event information initiates upon the activation of an event and does not end until the event is terminated. For example, the metering component 104 may be collecting metering information regarding the operating system while a panel member launches a web browser application and a media player application. For each new event initiated, a new instance of block 910 is initiated. Then, in block 912, the meter event input interface 320 within the metering component 104 polls the application adapters and/or hardware meters to determine if an event has terminated. If the event has not terminated, control goes back to block 910 to continue collecting metering information. If the event has terminated, control proceeds to block 914 where the event information collected by the application adapters and/or hardware meters is configured by the meter event input interface 320 into an event log. In another example implementation, the meter event input interface 320 continuously collects and store event information from the application adapters and/or hardware meters until the event is terminated, at which point the application adapters and/or hardware functions cease to send new metering information associated with the terminated event. In yet another implementation, the application adapters and/or hardware meters collect event information until the termination of the event. Then, the event information is sent to the meter event input interface 320.

After the event information has been added to the event log for the time period, block 916 is executed where the event log is stored to the event log cache 340 of FIG. 3. In an alternative implementation, the event log may not be stored to the event log cache 340 until the time period has expired. In this example, the event log contains all the event information and energy consumption data prior to storing within the event log cache 340. Next, the metering component 104 checks to determine if the time period has expired. If the time period has not expired, control returns to block 910 where the metering component 104 continues to collect event information. If the time period has expired, control moves to block 922 where the battery characteristics are measured. During this time, the metering component may additionally save the event information for any reaming events still being used by a panel member to the event log and store the event log to the event log cache 340. This enables the metering component 104 to collect and store information about events initiated within the time period, but which did not terminate within the time period. These events are stored as events that terminated at the conclusion of the time period. Additionally, these events may be initiated at the next time period if the next time period immediately follows the expired time period.

Once the battery characteristics have been measured at the conclusion of the time period, control proceeds to block 924 where the initial battery measurements are compared to the final battery measurements and the difference between the two measurements is stored to the event log. In another implementation, the metering component 104 may store the initial and final battery characteristic measurements. In yet another implementation, the metering component 104 may periodically measure battery characteristics during the time period and save these measurements to the event log. Next, in block 926, the metering component 104 determines if the event logs within the event log cache 340 should be transmitted to the collection system 102. If it is not time to transmit the event logs, control returns to block 902 where the metering component 104 monitors the portable device and waits for the next time period. If the event log is to be transmitted to the collection system 102, block 928 is executed. In block 928, the event logs within the event log cache 340 are transmitted to the collection system 102. The metering component 104 may have a preprogrammed schedule detailing the times to transmit the event logs. Alternatively, the event logs may be transmitted when the event log cache 340 has reached a certain capacity. In another example implementation, the collection system 102 may request the event logs from the metering component 104. In yet another example, the event logs may be transmitted when the portable device is in an idle state. The event logs may be transmitted wirelessly through a service provider network to the collection system 102 or, alternatively, through a personal computer with a wired connection to a network.

The method 950 begins at block 952 where the collection system 102 receives an event log from a portable device (block 952). Upon each instance of the collection system 102 receiving an event log, a new block 952 may be initiated. Once the collection system 102 receives an event log, the received event log is stored to the event log memory 204 (block 954). Once the event log is stored, the collection system 102 checks if the event logs within the event log memory 204 should be processed (block 956). If the event logs are not yet to be processed, control returns to block 952 and the collection system 102 waits for another event log. If the event logs are to be processed control passes to block 958. The decision to process the event logs may come from the metering service. Alternatively, conditions may be defined within the collection system 102 to specify when event logs are processed such as, for example, every Sunday at 8:00 P.M. and/or when the event log memory 204 reaches a certain capacity.

In block 958, the event processor 206 within the collection system 102 processes the event logs. This may include filtering the event logs for calculations and/or organizing the event logs. Then, the processed event logs are analyzed by the data analyzer 208 to calculate the energy consumption per event type (block 960). This may include calculating a least squares fit technique of linear equations representing event data within the event logs. Additionally, other data may be calculated from the event log such as market share for device types, market share for network usage, market share for applications, and/or device parametric information such as, for example, network quality, portable device quality, network data transfer speed, and/or energy consumption per hardware component type. Once the calculations have been finished in block 960, control passes to block 964. In block 964, the data calculated in block 962 is structured into a report format. The reports may include the energy consumption per event type on portable devices, the energy consumption per event per device type, the energy consumption per hardware type per portable device, the types of applications and/or hardware functions used per portable device, the metadata associated with the applications, device parametric information, market share information, etc.

Figure 10:
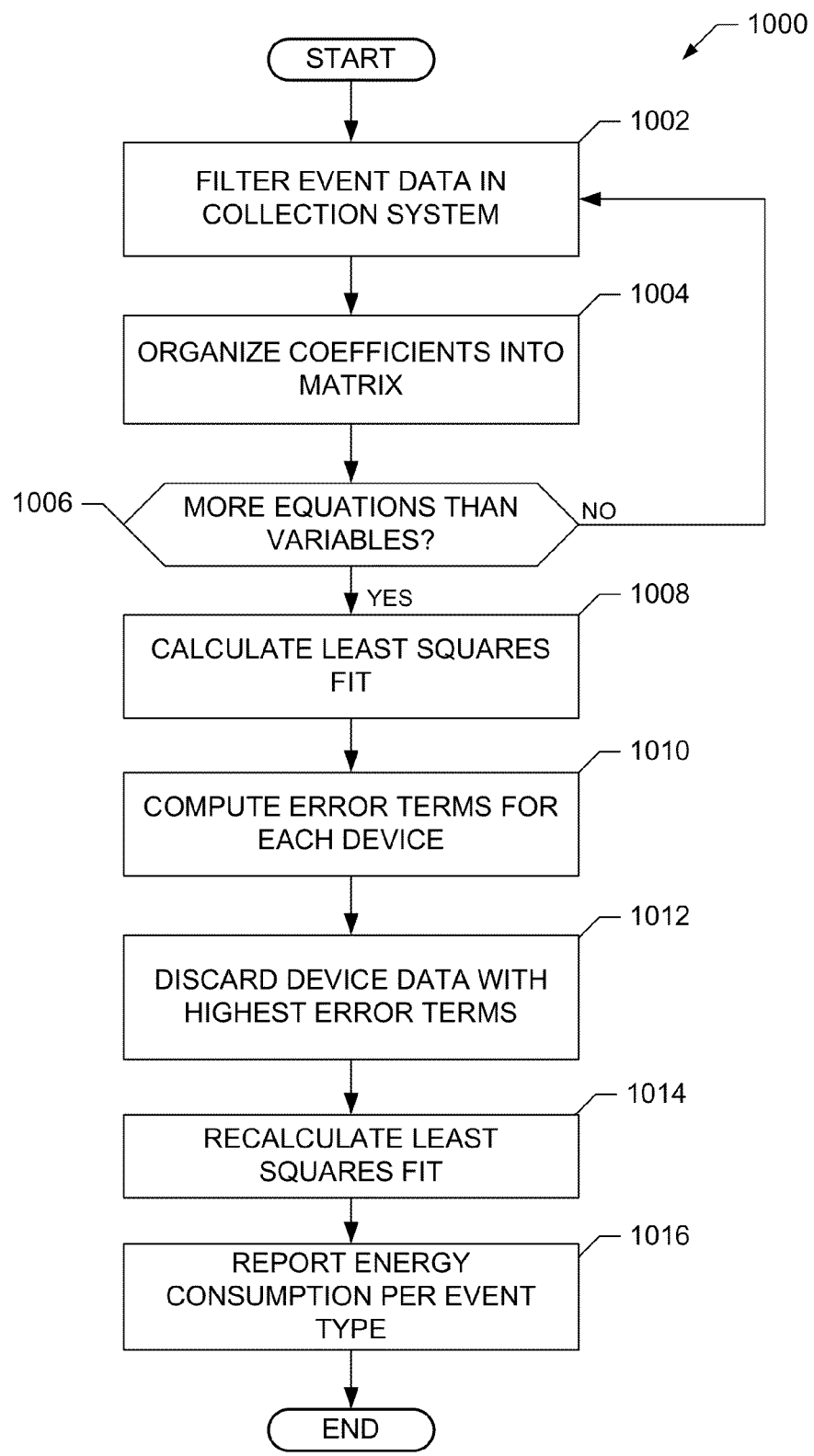
FIG. 10 is a flow chart illustrating an example method for calculating the energy consumed per event type on a portable device.

The example method 1000 of FIG. 10 may be performed to implement the example collection system 102 of FIG. 2. The example method 1000 may be executed at predetermined intervals, based on an occurrence of a predetermined event, etc., or any combination thereof. For example, the method 1000 may be executed in a metering service, server and/or system including the collection system 102, at predetermined intervals, such as hourly, daily, etc. Additionally or alternatively, the example method 1000 may be executed upon the occurrence of a trigger generated remotely such as, for example, on a system when event logs are processed by the data processor 208 of FIG. 2 within the collection system 102.

The method 1000 begins at block 1002 where event logs are filtered in the data processor 204 of FIG. 2 within the collection system 102. The event logs may be filtered according to device type, application types, hardware function types, panel member demographic information, time period length, the time of day the time period was metered, etc. For example, the data processor 206 may filter the event logs for event logs containing a portable device type of Dell Latitude D630™. In another example, the event logs may be filtered for devices that contain a camera application. Once the event logs have been filtered in block 1002, control proceeds to block 1004 where the data analyzer 208 structures the event logs into an event log compiler table 500 of FIG. 5. Next the data analyzer 208 structures each row of the event log compiler table 500 into a linear equation by summing the products of the length of time of the events and their corresponding energy consumption per unit of time variables to equal the measured energy consumption of the portable device during the time period. The linear equations are then organized into a coefficient matrix (e.g., event matrix 602 of FIG. 6). Next, the data analyzer 208 determines if the number of linear equations is equal or greater than the number of variables (block 1006). If there are more variables then linear equations, the data analyzer cannot perform an over-determined least squares fit on the data and control returns to block 1002 to filter additional event logs, or change the filter criteria. If there are more linear equations than variables, control proceeds to block 1008 where the data analyzer 208 calculates a least squares fit by creating an energy consumption matrix equation 600 of FIG. 6 and solving for the energy consumption variables. In an alternative implementation, block 1006 determines if the number of filtered event logs exceeds a value specified by the metering service. For example, the metering service may set the specified value to a number so that there are twice as many event logs as metered event types. The metering service may set the number of event logs to twice the number of metered events to increase the level of robustness of an over-determined least squares fit calculation. Additionally, the data analyzer 208 may perform other types of calculations.

Once the energy consumption variables have been solved, block 1010 is executed to compute the error terms of each linear equation. The error terms are calculated by substituting the energy consumption variable values into the linear equation and taking the absolute value of the difference between the calculated total energy consumption and the measured energy consumption. A large absolute value indicates a linear equation and associated event log with a high degree of error. In the next step, the data analyzer 208 removes the linear equations with the highest error terms (block 1012). This may include removing the linear equations with the highest 10% absolute error terms, the highest 5% positive error terms and the highest 5% negative error terms, and/or the error terms greater than three standard deviations from the mean of the error terms. The method and/or number of linear equations to remove may be determined by the metering service. The source of the error terms may come from differences within the chemical composition of batteries, viruses on the portable device, extreme operating conditions of the portable device, and/or errors within the metering component 104. After the linear equations with the highest error terms are removed, block 1014 is executed. In an alternative implementation, if the number of linear equations remaining is less than the number of variables, the method 1000 may be terminated, the original calculated data may be sent to block 1016, and/or the data analyzer 208 may end the calculation and return to block 1002.

In block 1014 the remaining linear equations are recalculated using the least squares fit to determine values for the energy consumption variables. The calculated data is sent to the database 210 in block 1016 where reports are generated for the energy consumption per event type. Method 1000 ends when the database 210 creates the reports of the energy consumption per event type for a unit of time.

Figure 11:
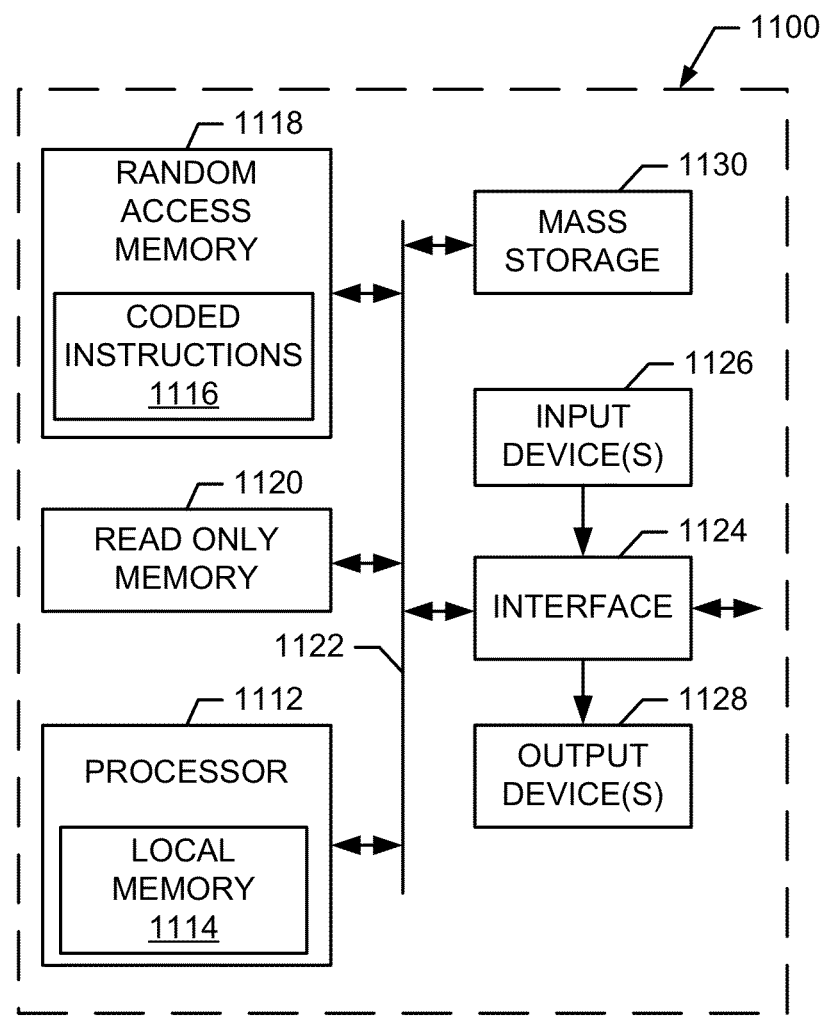
FIG. 11 is a block diagram of an example processor system that may be used to execute the example methods of FIGS. 8-10 and/or the example systems described herein.

FIG. 11 is a block diagram of an example computer system 1100 capable of implementing the apparatus and methods disclosed herein. The computer 1100 can be, for example, a server, a personal computer, a personal digital assistant (PDA), an Internet appliance, a DVD player, a CD player, a digital video recorder, a personal video recorder, a set top box, or any other type of computing device. Any or all of the example metering component 104, the collection system 102, the example data processor 206, the example event log memory 204, the example data analyzer 208, the example database 210, and/or the example processor on the portable devices 110-122 may be implemented in and/or implemented by the example computer 1100.

The system 1100 of the illustrated example includes a processor 1112 such as a general purpose programmable processor. The processor 1112 includes a local memory 1114, and executes coded instructions 1116 present in the local memory 1114 and/or in another memory device. The processor 1112 may execute, among other things, the machine readable instructions to perform the processes or methods represented in FIGS. 8, 9A, 9B, and/or 10. The processor 1112 may be any type of processing unit, such as one or more microprocessors from the Intel® Centrino® family of microprocessors, the Intel® Pentium® family of microprocessors, the Intel® Itanium® family of microprocessors, the Intel® Core® family of microprocessors, and/or the Intel® XScale® family of processors. Of course, other processors from other families are also appropriate.

The processor 1112 is in communication with a main memory including a volatile memory 1118 and a non-volatile memory 1120 via a bus 1122. The volatile memory 1118 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1120 may be implemented by flash memory and/or any other desired type of memory device. Access to the main memory 1118, 1120 is typically controlled by a memory controller (not shown) in a conventional manner.

The computer 1100 also includes a conventional interface circuit 1124. The interface circuit 1124 may be implemented by any type of well known interface standard, such as an Ethernet interface, a universal serial bus (USB), and/or a third generation input/output (3GIO) interface.

One or more input devices 1126 are connected to the interface circuit 1124. The input device(s) 1126 permit a user to enter data and commands into the processor 1112. The input device(s) can be implemented by, for example, a keyboard, a mouse, a touchscreen, a track-pad, a trackball, an isopoint and/or a voice recognition system.

One or more output devices 1128 are also connected to the interface circuit 1124. The output devices 1128 can be implemented, for example, by display devices (e.g., a liquid crystal display, a cathode ray tube display (CRT)), by a printer and/or by speakers. The interface circuit 1124, thus, typically includes a graphics driver card.

The interface circuit 1124 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The computer 1100 also includes one or more mass storage devices 1130 for storing software and data. Examples of such mass storage devices 1130 include floppy disk drives, hard drive disks, compact disk drives and digital versatile disk (DVD) drives. The mass storage devices 1130 may implement any or all of the metering components 104, event log cache 340, event log memory 204, the database 210, and/or the collection system 102. Additionally or alternatively, the volatile memory 1118 may implement any or all of the metering components 104, event log cache 340, event log memory 204, the database 210, and/or the collection system 102

At least some of the above described example methods and/or apparatus are implemented by one or more software and/or firmware programs running on a computer processor. However, dedicated hardware implementations including, but not limited to, application specific integrated circuits, programmable logic arrays and other hardware devices can likewise be constructed to implement some or all of the example methods and/or apparatus described herein, either in whole or in part. Furthermore, alternative software implementations including, but not limited to, distributed processing or component/object distributed processing, parallel processing, or virtual machine processing can also be constructed to implement the example methods and/or apparatus described herein.

It should also be noted that the example software and/or firmware implementations described herein are optionally stored on a tangible storage medium, such as: a magnetic medium (e.g., a magnetic disk or tape); a magneto-optical or optical medium such as an optical disk; or a solid state medium such as a memory card or other package that houses one or more read-only (non-volatile) memories, random access memories, or other re-writable (volatile) memories; or a signal containing computer instructions. A digital file attached to e-mail or other information archive or set of archives is considered a distribution medium equivalent to a tangible storage medium. Accordingly, the example software and/or firmware described herein can be stored on a tangible storage medium or distribution medium such as those described above or successor storage media.

To the extent the above specification describes example components and functions with reference to particular standards and protocols, it is understood that the scope of this patent is not limited to such standards and protocols. For instance, each of the standards for Internet and other packet switched network transmission (e.g., Transmission Control Protocol (TCP)/Internet Protocol (IP), User Datagram Protocol (UDP)/IP, HyperText Markup Language (HTML), HyperText Transfer Protocol (HTTP)) represent examples of the current state of the art. Such standards are periodically superseded by faster or more efficient equivalents having the same general functionality. Accordingly, replacement standards and protocols having the same functions are equivalents which are contemplated by this patent. Additionally, although this patent discloses example systems including software or firmware executed on hardware, it should be noted that such systems are merely illustrative and should not be considered as limiting. For example, it is contemplated that any or all of these hardware and software components could be embodied exclusively in hardware, exclusively in software, exclusively in firmware or in some combination of hardware, firmware and/or software. Accordingly, while the above specification described example systems, methods and articles of manufacture, persons of ordinary skill in the art will readily appreciate that the examples are not the only way to implement such systems, methods and articles of manufacture. Therefore, although certain example methods, apparatus and articles of manufacture have been described herein, the scope of coverage of this patent is not limited thereto. On the contrary, this patent covers all methods, apparatus and articles of manufacture fairly falling within the doctrine of equivalents.

What is claimed is:

1. A method, comprising:
    accessing, with a processor, first battery usage data for a first portable device, the first battery usage data including an energy usage by the first portable device during a first time period and an identification of software functions executed by the first portable device during the first time period;
    accessing, with the processor, second battery usage data for a second portable device, the second battery usage data including an energy usage by the second portable device during a second time period and an identification of software functions executed by the second portable device during the second time period; and
    determining, with the processor, a portion of the energy usage by the first and second portable devices attributable to a first one of the software functions based on the first and second battery usage data of the first and second portable devices.

2. A method as defined in claim 1, wherein the first battery usage data identifies a hardware function used by the first portable device during the first time period.

3. A method as defined in claim 2, further including determining a portion of the energy usage attributable to the hardware function.

4. An apparatus, comprising:
    an event log memory to store first battery usage data for a first portable device, the first battery usage data including an energy usage by the first portable device during a first time period and an identification of software functions executed by the first portable device during the first time period;
    the event log memory to store second battery usage data for a second portable device, the second battery usage data including an energy usage by the second portable device during a second time period and an identification of software functions executed by the second portable device during the second time period; and
    a logic circuit to determine a portion of the energy usage by the first and second portable devices attributable to a first one of the software functions based on the first and second battery usage data of the first and second devices.

5. An apparatus as defined in claim 4, wherein the first battery usage data includes a hardware function used by the first portable device during the first time period.

6. An apparatus as defined in claim 5, wherein the logic circuit is to execute computer readable instructions to determine energy usage attributable to the hardware function.

7. A tangible computer readable storage medium comprising computer readable instructions which, when executed, cause a processor to at least:
    access first battery usage data for a first portable device, the first battery usage data including an energy usage by the first portable device during a first time period and an identification of software functions executed by the first portable device during the first time period;

access second battery usage data for a second portable device, the second battery usage data including an energy usage by the second portable device during a second time period and an identification of software functions executed by the second portable device during the second time period; and determine the energy usage by the first and second portable devices attributable to a first one of the software functions based on the first and second battery usage data of the first and second portable devices.

8. A storage medium as defined in claim 7, wherein the first battery usage data identifies a hardware function used by the first portable device during the first time period.

9. A storage medium as defined in claim 8, wherein the instructions further cause the processor to determine a portion of the energy usage attributable to the hardware function.

10. A method, comprising:

collecting data associated with applications executing on a first device during a first period of time, the data including an amount of energy consumed by a portion of the first device during the first period of time;

collecting data associated with applications executing on a second device during a second period of time, the data including an amount of energy consumed by a portion of the second device during the second period of time;

determining, with a processor, an amount of energy consumed by a first one of the applications based on the amount of energy consumed by the portions of the first and second devices; and outputting a representation of the energy consumed by the first application.

11. A method as defined in claim 10, wherein the representation identifies the amount of energy consumed per unit of time by the first application.

12. A method as defined in claim 10, wherein the representation identifies energy consumed by the first application during a second period of time later than the first period of time.

* * * * *